United States Patent
Seo

(10) Patent No.: US 11,088,144 B2
(45) Date of Patent: Aug. 10, 2021

(54) SEMICONDUCTOR DEVICE AND METHOD OF MANUFACTURING THE SAME

(71) Applicant: Samsung Electronics Co., Ltd., Suwon-si (KR)

(72) Inventor: Hyeoung-won Seo, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/529,364

(22) Filed: Aug. 1, 2019

(65) Prior Publication Data
US 2020/0161306 A1    May 21, 2020

(30) Foreign Application Priority Data
Nov. 19, 2018 (KR) .................. 10-2018-0142514

(51) Int. Cl.
*H01L 27/108* (2006.01)
*H01L 29/78* (2006.01)
*H01L 21/764* (2006.01)

(52) U.S. Cl.
CPC .. *H01L 27/10823* (2013.01); *H01L 27/10876* (2013.01); *H01L 21/764* (2013.01); *H01L 27/10814* (2013.01); *H01L 29/7827* (2013.01)

(58) Field of Classification Search
CPC ......... H01L 27/10823; H01L 27/10876; H01L 27/10814; H01L 21/764; H01L 29/7827; H01L 21/76224; H01L 21/7621
USPC ......... 257/334, 330, 332; 438/259, 270, 271
See application file for complete search history.

(56) References Cited

U.S. PATENT DOCUMENTS

| | | | |
|---|---|---|---|
| 6,635,543 B2 | 10/2003 | Furukawa et al. |
| 6,759,282 B2 | 7/2004 | Campbell et al. |
| 6,939,763 B2 | 9/2005 | Schlosser et al. |
| 7,141,853 B2 | 11/2006 | Campbell et al. |
| 7,195,972 B2 | 3/2007 | Chidambarrao et al. |
| 7,358,144 B2 | 4/2008 | Im |
| 7,459,358 B2 | 12/2008 | Lee et al. |
| 7,491,603 B2 | 2/2009 | Seo et al. |
| 7,550,330 B2 | 6/2009 | Dyer et al. |
| 7,655,973 B2 | 2/2010 | Mouli |
| 7,759,714 B2 | 7/2010 | Itoh et al. |
| 7,880,267 B2 | 2/2011 | El-Kareh |
| 7,915,673 B2 | 3/2011 | Mouli |
| 8,102,000 B2 | 1/2012 | Krivokapic |

(Continued)

FOREIGN PATENT DOCUMENTS

KR   10-2007-0070890 A   7/2007
KR   10-2017-0043683 A   4/2017

*Primary Examiner* — Thinh T Nguyen
(74) *Attorney, Agent, or Firm* — Muir Patent Law, PLLC

(57) ABSTRACT

A semiconductor device includes a substrate comprising a plurality of active regions extending in a first direction and a device isolation region electrically isolating the plurality of active regions, a gate trench extending across the plurality of active regions and the device isolation region, a gate structure extending in the gate trench of each of and along opposite sidewalls of the plurality of active regions, a gate dielectric film formed between the gate trench and the gate structure in each of the plurality of active regions, and an insulating barrier film provided in each of the plurality of active regions under the gate trench spaced apart from a lower surface of the gate trench and extending in an extension direction of the gate trench.

20 Claims, 26 Drawing Sheets

(56) References Cited

U.S. PATENT DOCUMENTS

| | | |
|---|---|---|
| 8,618,592 B2 | 12/2013 | Cho et al. |
| 8,686,494 B2 | 4/2014 | Mouli |
| 9,177,851 B2 | 11/2015 | Min |
| 9,196,729 B2 | 11/2015 | Lee et al. |
| 9,431,496 B2 | 8/2016 | Kang |
| 9,455,329 B2 | 9/2016 | Min et al. |
| 2005/0077574 A1 | 4/2005 | Mouli |
| 2011/0003459 A1* | 1/2011 | Shin et al. ............ H01I 29/4236 438/430 |
| 2014/0367775 A1* | 12/2014 | Min .................. H01L 21/76224 257/334 |
| 2015/0104934 A1* | 4/2015 | Kim .................... H01L 29/4246 438/587 |
| 2018/0204912 A1 | 7/2018 | Fung et al. |

* cited by examiner

SEMICONDUCTOR DEVICE AND METHOD OF MANUFACTURING THE SAME

CROSS-REFERENCE TO RELATED APPLICATION

This application claims the benefit of Korean Patent Application No. 10-2018-0142514, filed on Nov. 19, 2018, in the Korean Intellectual Property Office, the disclosure of which is incorporated herein in its entirety by reference.

BACKGROUND

The inventive concept relates to a semiconductor device, and more particularly, to a semiconductor device having a reduced leakage current, excellent switching characteristics, and superior reliability.

As the size of a semiconductor apparatus decreases, an interval between the constituent elements is reduced, and thus phenomena that were not considered as problems in the past have become problematic. In a memory device, there is an increasing possibility that electrical interference between two adjacent signal lines increases, and thus a solution to address this problem is required. Furthermore, there is a demand for securing device reliability by reducing leakage current.

SUMMARY

The inventive concept provides a semiconductor device having a reduced leakage current, excellent switching characteristics, and superior reliability. The inventive concept also provides for methods for manufacturing the same.

According to some examples, a substrate provided with a plurality of active regions, each of the active regions extending in a first direction that is a horizontal direction and protruding in a vertical direction; a device isolation region electrically isolating the plurality of active regions; a gate trench formed in and extending across both the plurality of active regions and the device isolation region; a gate structure formed in the gate trench contacting opposite side walls of the gate trench, the gate structure extending through each of the plurality of active regions and along opposite sidewalls of each of the plurality of active regions; a gate dielectric film formed between gate trench surfaces and the gate structure in each of the plurality of active regions; and an insulating barrier film provided in each of the plurality of active regions under the gate trench, spaced apart from a lower surface of the gate trench.

In some examples, the insulating barrier film may extend through each of the active regions in an extension direction of the gate trench.

In some examples, the insulating barrier film has a width that tapers in a downward direction.

In some examples, the insulating barrier film comprises an air gap.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
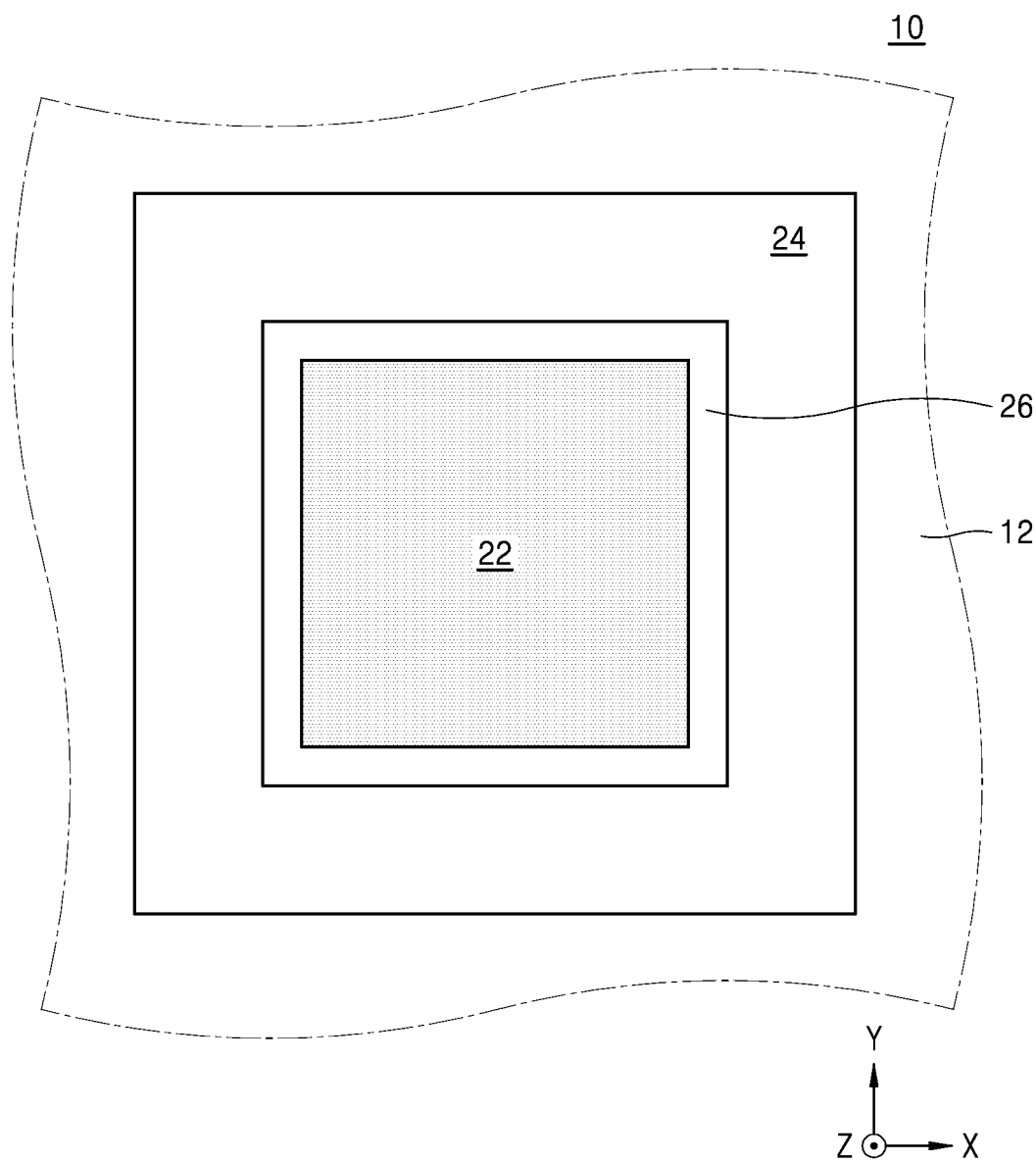
FIG. 1 is a schematic plan view of a configuration of an integrated circuit device according to embodiments of the inventive concept.

Embodiments of the inventive concept are described in detail with reference to the accompanying drawings. Like reference numerals in the drawings denote like elements, and detailed descriptions thereof will be omitted herein.

FIG. 1 is a schematic plan view of a configuration of an integrated circuit device 10 according to embodiments of the inventive concept.

The integrated circuit device 10 may include a substrate 12 that includes a first region 22, a second region 24 surrounding the first region 22, and an interface area 26 between the first region 22 and the second region 24.

The substrate 12 may be and/or comprise a crystalline semiconductor material, for example, Si or Ge, or at least one compound semiconductor selected from among SiGe, SiC, GaAs, InAs, and InP. The substrate 12 may include a conductive area, for example, a well doped with impurities or a structure doped with impurities.

In some embodiments, the first region 22 may be a memory cell area of the integrated circuit device 10. In some embodiments, the first region 22 may be a memory cell area of dynamic random access memory (DRAM). Each memory cell of the first region 22 may comprise a transistor connected to a capacitor, or a switching device connected to a variable resistor.

The second region 24 may be a core region or a peripheral circuit region (hereinafter, referred to as the "peripheral circuit region"). Peripheral circuits needed for driving memory cells in the first region 22 may be arranged in the second region 24. Although not illustrated, peripheral circuit such as an inverter chain or an input/output circuit also may be formed in the second region 24.

A plurality of conductive lines may extend between the first region 22 and the second region 24 through interface area 26 to electrically connect various circuit elements in the first region 22 and the second region 24. Insulating structures insulating the first region 22 from the second region 24 may be arranged in the interface area 26.

Figure 2:
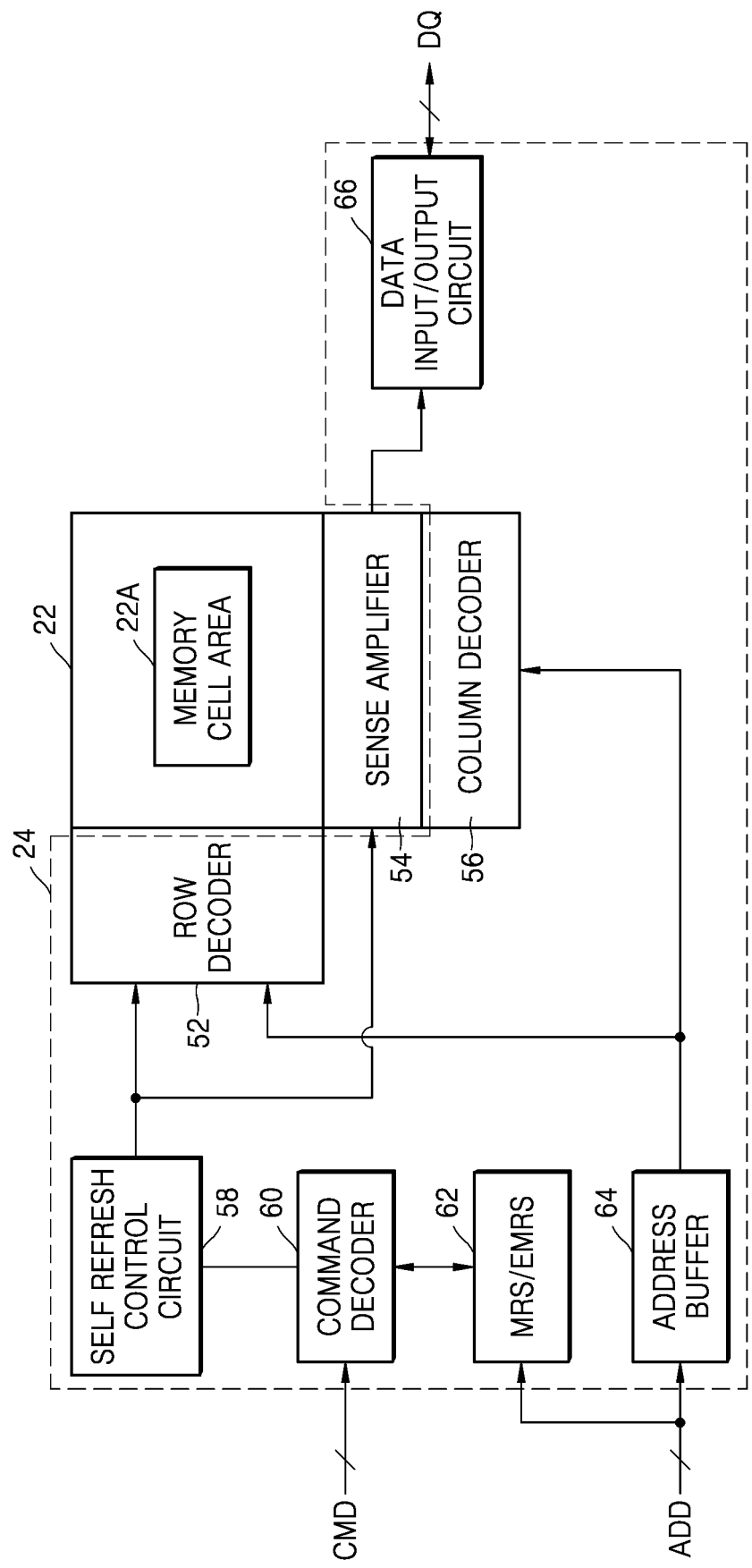
FIG. 2 is a block diagram of an exemplary configuration of the integrated circuit device provided as a DRAM device.

FIG. 2 is a block diagram of an exemplary configuration of the integrated circuit device 10 provided as a DRAM device.

Referring to FIG. 2, in the integrated circuit device 10, the first region 22 may correspond to a memory cell area of a DRAM device and the second region 24 may correspond to a peripheral circuit region of the DRAM device. In this case, the first region 22 may also identify a memory cell array. The first region 22 may include one or more memory cell regions 22A. A plurality of memory cells for storing data may be arranged rows and columns in the memory cell region 22A. Each of the memory cells may include a cell capacitor and an access transistor. A gate of the access transistor may be connected to a corresponding one of a plurality of word lines arranged in the row direction. One of a source and a drain of the access transistor may be connected to a bit line (which may also act as a complementary bit line) arranged in the column direction, and the other of the source and the drain may be connected to the cell capacitor. Depending on the operation of the transistor, the source and drain of the transistor may assume opposite roles and accordingly each may be referenced as a source/drain herein.

The second region 24 may include a row decoder 52, a sense amplifier array 54, a column decoder 56, a self-refresh control circuit 58, a command decoder 60, a mode register set/extended mode register set (MRS/EMRS) circuit 62, an address buffer 64, and a data input/output circuit 66.

The sense amplifier array 54 may comprise a plurality of sense amplifiers, each of which may sense and amplify data of a memory cell and store data in a memory cell. The sense amplifiers of the sense amplifier array 54 may be implemented by a cross-coupled amplifier that is connected between a corresponding bit line and a corresponding complementary bit line included in the memory cell region 22A.

Data DQ from an external device may be input through the data input/output circuit 66 is written to the memory cell array 22 based on an address signal ADD. The data DQ read out from the memory cell array 22 based on the address signal ADD may be output to the outside through the data input/output circuit 66. To assign a memory cell to write or read data, the address signal ADD may be input to the address buffer 64. The address buffer 64 may temporarily store the address signal ADD that is received from the external device.

The row decoder 52 may decode a row address of the address signal ADD output from the address buffer 64 to assign a word line connected to a memory cell to input or output data. In other words, in a data write or read mode, the row decoder 52 may decode a row address output from the address buffer 64 to enable (activate) a corresponding word line identified by the decoded row address. Furthermore, in a self-refresh mode, the row decoder 52 may decode a row address generated by an internal address counter (not shown) to enable a corresponding word line.

The column decoder 56 may decode a column address of the address signal ADD output from the address buffer 64 to assign a bit line connected to the memory cell to input or output data. The memory cell array 22 may output data from or write data to the memory cell(s) identified by the row and column addresses.

The command decoder 60 may receive a command signal CMD that is received from the external device and decode the signals to internally generate a decoded command signal, for example, a read command, a write command, a self-refresh enter command, a self-refresh exit command, etc.

The MRS/EMRS circuit 62 may set an internal mode register in response to an MRS/EMRS command to assign an operation mode of the integrated circuit device 10 and the address signal ADD.

Although not illustrated in FIG. 2, the integrated circuit device 10 may further include a clock circuit for generating a clock signal or a power circuit for receiving an externally applied power voltage and generating or distributing an internal voltage.

The self-refresh control circuit 58, in response to a command output from the command decoder 60, may control a self-refresh operation of the integrated circuit device 10. The command decoder 60 may include the address counter, a timer, and a core voltage generator. The address counter, in response to a self-refresh enter command output from the command decoder 60, may generate a row address to assign a row address subject to self-refresh and apply the generated row address to the row decoder 52. The address counter in response to a self-refresh exit command output from the command decoder 60 may stop a counting operation.

Figure 3:
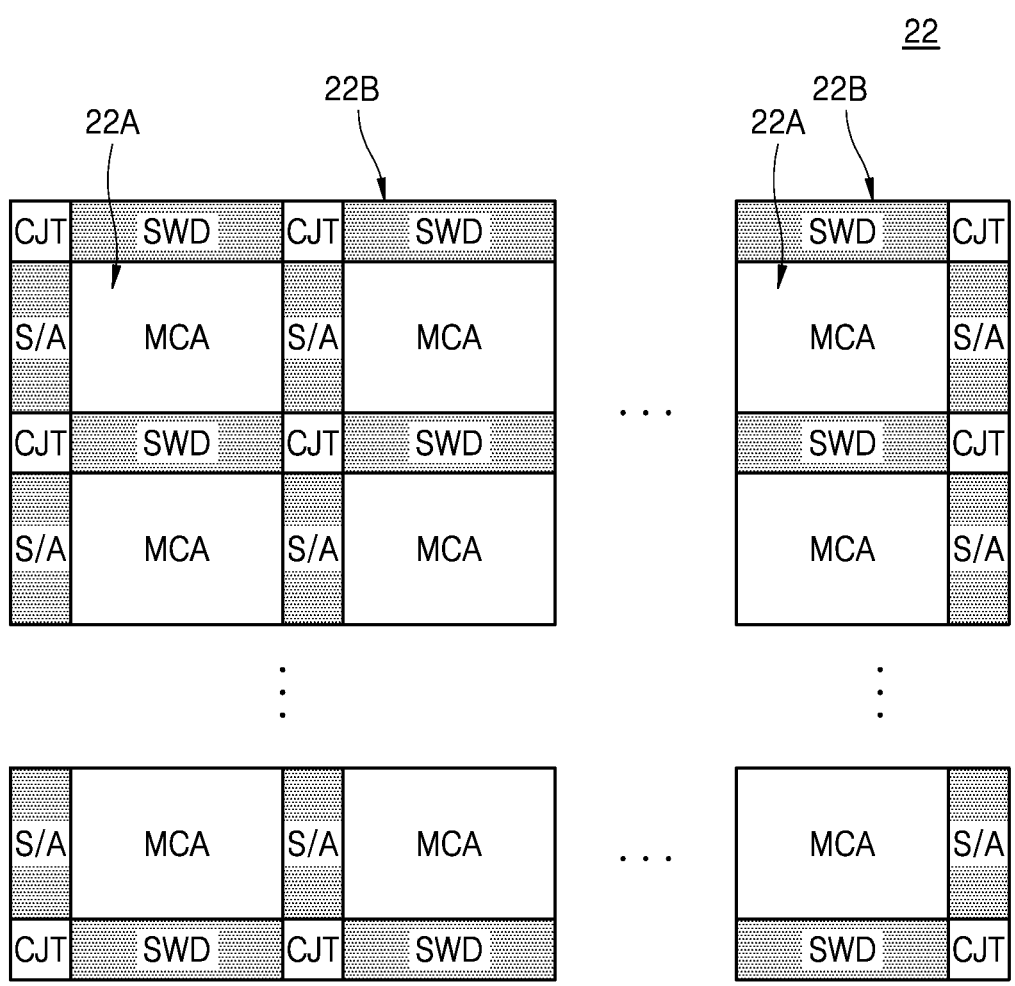
FIG. 3 is a schematic plan view of a configuration of an integrated circuit device according to other embodiments of the inventive concept.

FIG. 3 is a schematic plan view of a configuration of an integrated circuit device 70 according to other embodiments of the inventive concept. In FIGS. 1 and 3, like reference numerals denote like elements, and detailed descriptions thereof are omitted.

Referring to FIG. 3, memory cell array 22 (the first region 22) of the integrated circuit device 70 may include plural memory cell regions 22A. Each of the memory cell regions 22A may be surrounded by the regions 22B. In the integrated circuit device 70, the memory cell regions 22A (or memory cell areas MCA) may include memory cells of a DRAM device, and regions 22B may comprise sense amplifiers S/A, sub word line drivers SWD and conjunction areas CJT containing vias for electrical connections between different layers.

The regions 22B may include a sub-word line driver (SWD) blocks (including plural sub-word line drivers), a sense amplifier (S/A) block (including plural sense amplifiers), and a conjunction (CJT) block (including plural vias for electrical connections between different layers of the integrated circuit device 70). In the regions 22B, a plurality of SWD blocks are arranged in a word line direction of the memory cell regions 22A, and a plurality of S/A blocks may be arranged in a bit line direction. In an S/A block, a plurality of bit-line sense amplifiers may be arranged. A CJT block may be located at a position where the SWD blocks and the S/A blocks cross each other. In the CJT block, a power driver for driving a bit-line sense amplifier and a ground driver may be alternately arranged.

Figure 4:
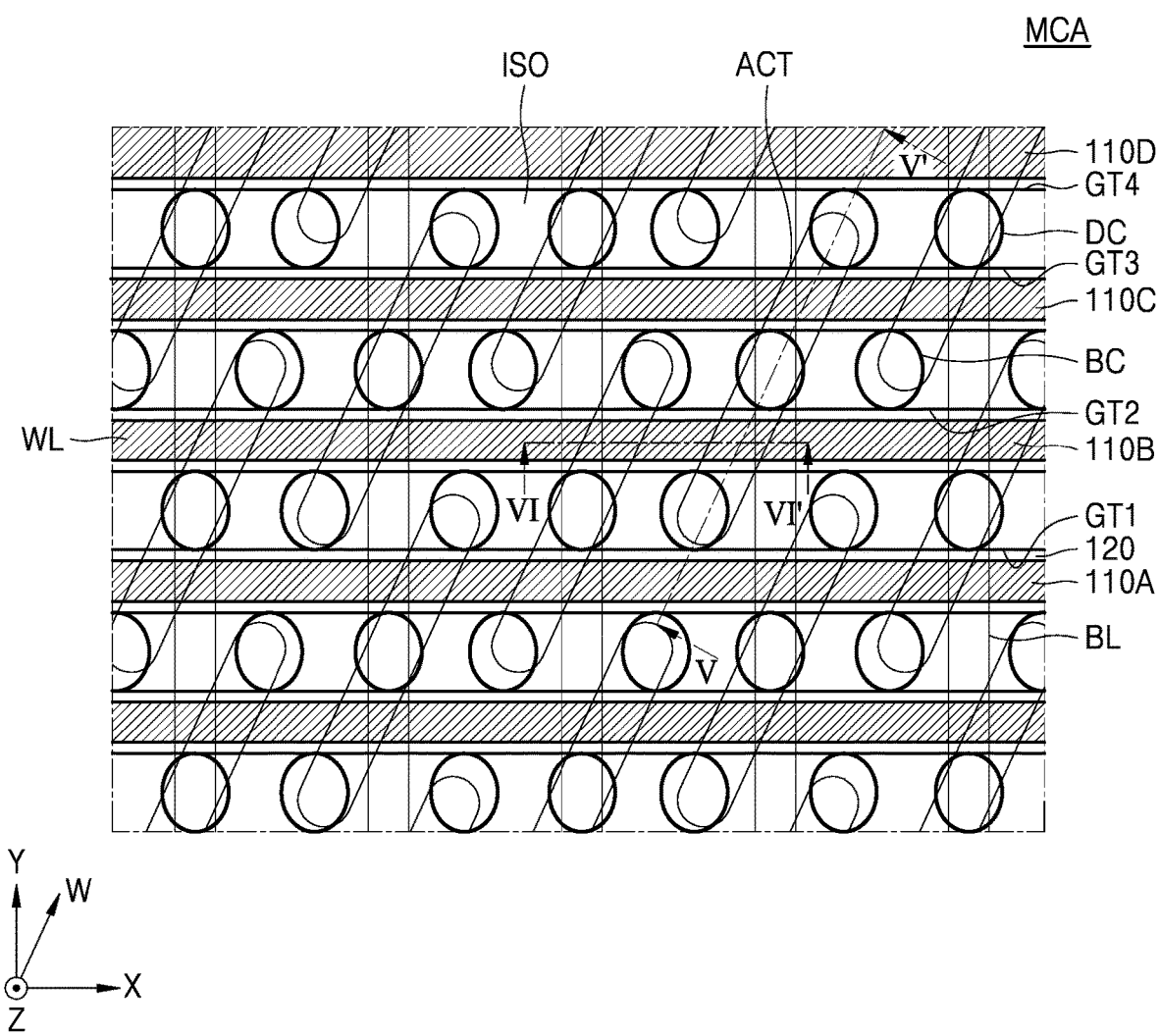
FIG. 4 is a plan view of a layout for describing main elements of a memory cell array area of FIG. 3.

FIG. 4 is a plan view of a layout for describing main elements of the memory cell regions 22A (MCA) of FIG. 3.

Referring to FIG. 4, area memory cell region 22A may include a plurality of active regions ACT. The active regions ACT may be arranged such that each of the active regions ACT has the major axis extending in a first direction (W-axis direction). The active regions ACT may be fins extending from a surface of the substrate 101 and constitute fin active regions. The length of each of the fins of the active regions ACT extend in the first direction (W-axis direction) in this example. Groups of the active regions ACT may be arranged side by side in a second direction (X-axis direction) and groups of the active regions ACT may be arranged side by side in a third direction (Y-axis direction). In this example, the second direction (X-axis direction) corresponds to the row direction and third direction (Y-axis direction) corresponds to the column direction and the second direction (X-axis direction) is perpendicular to the third direction (Y-axis direction). The W-axis direction is oblique to both the second direction (X-axis direction) and third direction (Y-axis direction). Each of the first direction (W-axis direction), the second direction (X-axis direction) and third direction (Y-axis direction) are horizontal directions extending parallel to an upper surface and lower surface of the substrate of the semiconductor device 100.

A plurality of word lines WL may extend parallel to each other in the second direction (X-axis direction) crossing the active regions ACT. A plurality of bit lines BL may extend, above the word lines WL, parallel to each other in the third direction (Y-axis direction) crossing the second direction (X-axis direction). The bit lines BL may be connected to the active regions ACT through a direct contact DC centered on each of the active regions ACT.

A plurality of buried contacts BC may extend between neighboring bit lines BL. Each end of each active region ACT may be connected to a buried contacts BC. In FIG. 4, black circles centered on an active are ACT represent a direct contact DC and black circles at an end of an active region represent a buried contact BC. The buried contacts BC may be arranged linearly in the second direction (X-axis direction) and extend in the third direction (Y-axis direction) in a zig-zag arrangement. In some embodiments, a plurality of landing pads (not shown) may be formed on the buried contacts BC. The buried contacts BC and the landing pads connect a lower electrode (not shown) of a capacitor formed above the bit lines BL to the active regions ACT. Each of the landing pads may be arranged to partially overlap the buried contacts BC.

Figure 5:
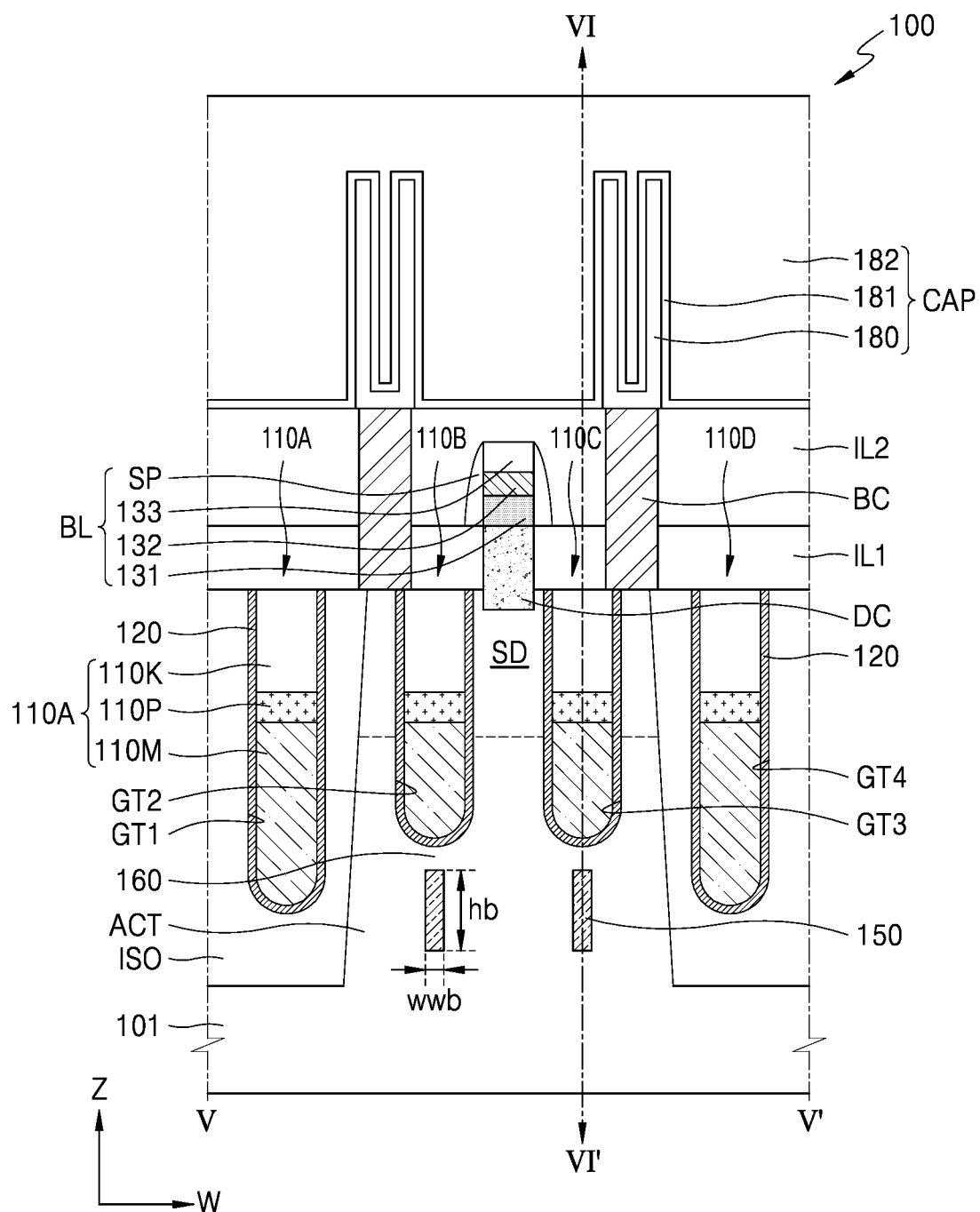
FIG. 5 is a cross-sectional view of some elements taken along line V-V' of FIG. 4, for describing main elements of a semiconductor device according to embodiments of the inventive concept.

FIG. 5 is a cross-sectional view of some elements taken along line V-V' of FIG. 4, for describing main elements of a semiconductor device 100 according to embodiments of the inventive concept.

Figure 6:
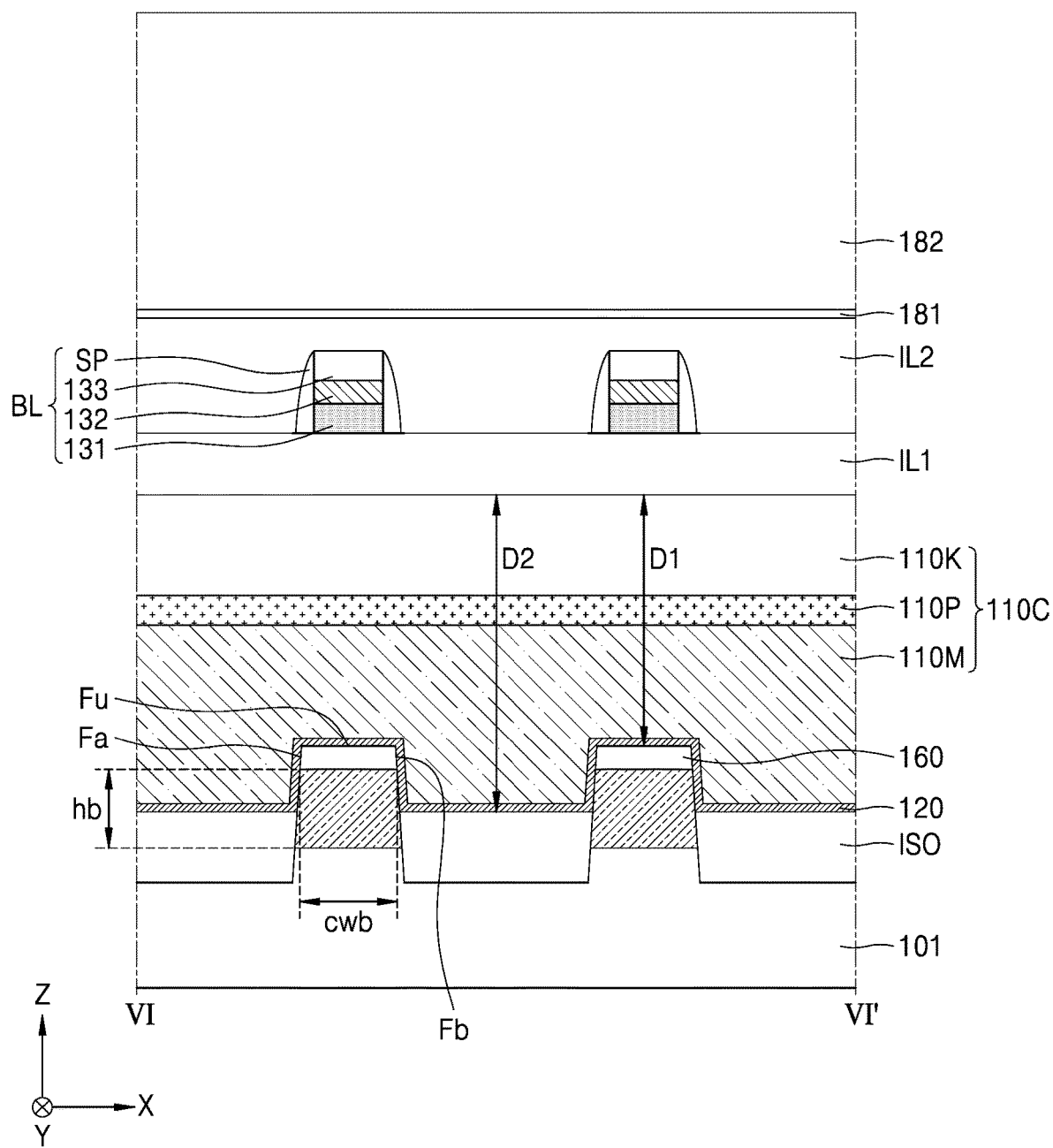
FIG. 6 is a cross-sectional view of some elements taken along line VI-VI' of FIG. 4, for describing main elements of a semiconductor device according to embodiments of the inventive concept.

FIG. 6 is a cross-sectional view of some elements taken along line VI-VI' of FIG. 4, for describing main elements of the semiconductor device 100 of FIG. 5.

Referring to FIGS. 4 to 6, a substrate 101 may include a plurality of active regions ACT and a device isolation region ISO for electrically isolating the active regions ACT.

The substrate 101 may include a bulk silicon substrate, a silicon-on-insulator (SOI) substrate, a germanium substrate, a germanium-on-insulator (GOI) substrate, a silicon-germanium substrate, or an epitaxial thin film substrate obtained by performing selective epitaxial growth (SEG).

The active regions ACT of the substrate 101 each may have a fin shape, and the major axis of each of the active regions ACT may extend in the first direction (W-axis direction) that is inclined with respect to the extending directions of the word lines WL and the bit lines BL.

The device isolation region ISO may surround and electrically isolate the active regions ACT from each other. The device isolation region ISO may be or include a high density plasma (HDP) oxide film, tetraethyl orthosilicate (TEOS), plasma enhanced TEOS (PE-TEOS), O$_3$-TEOS, undoped silicate glass (USG), phospho silicate glass (PSG), borosilicate glass (BSG), borophosphosilicate glass (BPSG), fluoride silicate glass (FSG), spin on glass (SOG), tonen silazene (TOSZ), or a combination thereof.

First to fourth gate trenches GT1, GT2, GT3, and GT4 extend across the active regions ACT and the device isolation region ISO. The first to fourth gate trenches GT1, GT2, GT3, and GT4 extend in the X direction to alternately pass through the active regions ACT and the device isolation region ISO.

In FIG. 5, the first gate trench GT1 and the fourth gate trench GT4 are shown passing through (and formed in) the device isolation region ISO, and the second gate trench GT2 and the third gate trench GT3 are shown passing through (and formed in) the active regions ACT. However, as shown in FIG. 4, the first to fourth gate trenches GT1, GT2, GT3, and GT4 extend through plural active regions and portions of the device isolation region ISO disposed therebetween.

A gate dielectric film 120 may be provided on an inner surface of each of the first to fourth gate trenches GT1, GT2, GT3, and GT4 in the active regions ACT. The gate dielectric film 120 may be a silicon oxide film, a silicon nitride film, a silicon oxynitride film, an oxide/nitride/oxide (ONO) film, and/or a high-k dielectric film having a dielectric constant higher than that of a silicon oxide film. The high-k dielectric film may have a dielectric constant of about 10 to about 25 and may be/include, for example, HfO$_2$, Al$_2$O$_3$, HfAlO$_3$, Ta$_2$O$_3$, or TiO$_2$.

In some embodiments, at least a part of the gate dielectric film 120 may be obtained by thermally oxidizing the active regions ACT. However, the inventive concept is not limited thereto. In some embodiments, the gate dielectric film 120 may be a stack structure of a layer obtained by thermally oxidizing the active regions ACT and a layer deposited by using a method such as atomic layer deposition (ALD) and/or chemical vapor deposition (CVD).

When the gate dielectric film 120 is formed by deposition, the gate dielectric film 120 may be provided on the inner surfaces of the first to fourth gate trenches GT1, GT2, GT3, and GT4 in the device isolation region ISO. The gate dielectric film 120 may extend on sidewalls of the first to fourth gate trenches GT1, GT2, GT3, and GT4 and may extend on these sidewalls to a top of the first to fourth gate trenches GT1, GT2, GT3, and GT4 as shown in FIG. 5.

First to fourth gate structures 110A, 110B, 110C, and 110D are respectively provided in the first to fourth gate trenches GT1, GT2, GT3, and GT4. Each of the first to fourth gate structures 110A, 110B, 110C, and 110D may be a gate stack and include a lower gate line 110M, an upper gate line 110P, and a capping layer 110K covering the upper gate line 110P.

The lower gate line 110M may be/include, for example, conductive metal or a conductive nitride thereof. In some embodiments, the lower gate line 110M may include Ti, TiN, Ta, TaN, W, WN, TiSiN, WSiN, or a combination thereof. However, the inventive concept is not limited thereto.

The upper gate line 110P may be, for example, doped polysilicon. However, the inventive concept is not limited thereto.

The capping layer 110K may be a silicon nitride film, a silicon oxynitride film, a silicon oxide film, or a combination thereof.

Each of the first to fourth gate structures 110A, 110B, 110C, and 110D may extend across various ones of the active regions ACT and the device isolation region ISO. Each of the first to fourth gate structures 110A, 110B, 110C, and 110D may extend in a lengthwise direction and alternately pass through the active regions ACT and the device isolation region ISO.

FIG. 5 illustrates portions of the first gate structure 110A and the fourth gate structure 110D passing through the device isolation region ISO, and portions of the second gate structure 110B and the third gate structure 110C passing through the active region ACT. In some embodiments, the first to fourth gate structures 110A to 110D may have substantially the same width. In some embodiments, the first gate structure 110A to the fourth gate structure 110D may be arranged to be spaced apart from neighboring gate structures 110 with the same interval (e.g., arranged at a constant pitch in the Y direction, as shown in FIG. 4).

Each of the first to fourth gate structures 110A, 110B, 110C, and 110D may have three surfaces adjacent to each active region ACT through which it extends with the gate dielectric film 120 formed therebetween. When passing through the active regions ACT, the first to fourth gate structures 110A, 110B, 110C, and 110D may face an upper surface Fu of each of the active regions ACT with the gate dielectric film 120 therebetween (shown in FIG. 6 with respect to second gate structure 110B). Furthermore, the first to fourth gate structures 110A, 110B, 110C, and 110D may face the two opposite side walls Fa and Fb of the active regions ACT with the gate dielectric film 120 therebetween. The two side walls Fa and Fb of each active region ACT under a gate structure 110 may extend from the upper surface Fu of the active region ACT that is under a gate structure 110 to a bottom of the protruding active region ACT. Sidewalls FA and Fb of each active region ACT may have upper portions adjacent to and in contact with the gate dielectric film 120 and lower portions adjacent to and in contact with the device isolation region ISO.

A depth D1 of each of the first to fourth gate trenches GT1, GT2, GT3, and GT4 in the active regions ACT is less than a depth D2 first to fourth gate trenches GT1, GT2, GT3, and GT4 in the device isolation region ISO. Upper surfaces of the active region ACT under a gate trench GT are higher than upper surfaces of device isolation region ISO under gate trenches GT, as shown in FIGS. 5 and 6.

A plurality of source/drain areas SD doped with impurities may be formed in upper portions of the active regions ACT.

In the active regions ACT under gate trenches GT, an insulating barrier film 150 may be provided. FIG. 5 shows insulating barrier films 150 formed under the second and third gate trenches GT2 and GT3, respectively and respectively spaced apart from lower surfaces of the second and third gate trenches GT2 and GT3.

The insulating barrier film 150 may have a width wwb in the first direction (that is, the W-axis direction) and a height hb in the Z-axis direction. Furthermore, the insulating barrier film 150 may have a width cwb in a channel width direction. The dimensions and position of insulating barrier film 150 may be determined considering that a channel region 160 is formed above an upper end of the insulating barrier film 150 and lower surfaces of the second and third gate trenches GT2 and GT3.

As can be seen from FIG. 6, the cross-section VI-VI' of the active regions ACT under a gate trench GT may having a height greater than its width. In some embodiments, the width cwb in the channel width direction of the insulating barrier film 150 may be defined by a dimension in the second direction (that is, the X-axis direction) of the top portion of the insulating barrier film 150. In some embodiments, the width cwb in the channel width direction of the insulating barrier film 150 may be substantially the same as the width of the channel region formed by the active regions ACT. For example, both the channel region 160 and the insulating barrier film 150 may extend from one sidewall Fa to the other sidewall Fb of the active region ACT under gate trench GT.

The dimension wwb in the first direction, that is, the W-axis direction, of the insulating barrier film 150 (width wwb in FIG. 5) may be less than the dimension in the first direction of each of the first to fourth gate trenches GT1, GT2, GT3, and GT4 (a width of the gate trenches GT shown in FIG. 5 in the W-axis direction). Furthermore, the dimension in the first direction, that is, in the W-axis direction, of the insulating barrier film 150 (width wwb) may be less than the dimension in the first direction of each of the first to fourth gate structures 110A, 110B, 110C, and 110D (a width of the gate structures 110 GT shown in FIG. 5 in the W-axis direction).

As shown in FIG. 5, the bottom (i.e., lower end) of the insulating barrier film 150 may be lower than the bottom (or lower end) of gate structures in the device isolation region ISO. For example, FIG. 5 illustrates the bottom of insulating barrier film 150 being lower than the bottom of gate structures 110A and 110D formed in device isolation region ISO. Further, the top (i.e., the upper end) of the insulating barrier film 150 may be higher than the bottom of the gate structures in the device isolation region ISO (in FIG. 5, higher than the than the bottom of gate structures 110A and 110D formed in device isolation region ISO).

In some embodiments, the width in the first direction (W-axis direction) of the insulating barrier film 150 wwb may be in the range of about 2 nm to about 10 nm in the first direction. In some embodiments, the insulating barrier film 150 may have a height (in the Z-axis direction) hb in the range of about 3 nm to about 25 nm in the Z-axis direction. The width in the channel width direction (X-direction) cwb of the insulating barrier film 150 may be in the range of about 10 nm to about 35 nm.

The insulating barrier film 150 may be an electric insulator such as silicon nitride, silicon oxide, or silicon oxynitride. The insulating barrier film 150 may contribute to reduction or removal of mutual interference from the gate structures or bit lines of neighboring cells. In detail, the insulating barrier film 150 may prevent or reduce leakage current applied to the neighboring cells, which would otherwise occur if the insulating barrier film 150 does not exist. As a result, a device having excellent switching characteristics may be obtained.

Furthermore, the bit lines BL may extend, above the active regions ACT, in a direction different from the first direction (W-axis direction), for example, in the third direction (Y-axis direction). In some embodiments, the bit lines BL may extend in the third direction (Y-axis direction) that is orthogonal to the second direction (X-axis direction) in which the word lines WL, that is, the first to fourth gate structures 110A, 110B, 110C, and 110D, extend.

The bit lines BL may be connected to the active regions ACT through corresponding direct contacts DC extending through a first interlayer insulating film IL1.

The direct contact DC may include a contact semiconductor layer. In some embodiments, the contact semiconductor layer may be a polysilicon doped with a P-type dopant or an N-type dopant. For example, the direct contact DC may be a polysilicon layer doped at a doping concentration selected from a range of about $1 \times 10^{20}$ cm$^{-3}$ to about $9 \times 10^{20}$ cm$^{-3}$.

The bit lines BL may include a first conductive layer 131, a second conductive layer 132 disposed on the first conductive layer 131, a capping layer 133 disposed on the second conductive layer 132, and a spacer SP formed on side surfaces of the first conductive layer 131, the second conductive layer 132, and the capping layer 133.

The first conductive layer 131 may be a semiconductor layer and may contact an upper surface of the direct contact DC. The first conductive layer 131 may have a doping concentration higher than the doping concentration of a contact semiconductor material forming the direct contact DC. In some embodiments, the first conductive layer 131 may be polysilicon doped with a P-type dopant or an N-type dopant. The first conductive layer 131 may be doped with the same conductive dopant as the dopant included in the direct contact DC. For example, the first conductive layer 131 may include a polysilicon layer doped at a doping concentration selected from a range of about $2 \times 10^{20}$ cm$^{-3}$ to about $9 \times 10^{21}$ cm$^{-3}$.

The second conductive layer 132 may be TiSiN, TiN, TaN, CoN, metal, metal silicide, or a combination thereof. The metal and the metal of the metal silicide may be W, Mo, Au, Cu, Al, Ni, or Co. The second conductive layer 132 may be a single layer or a stack of two or more layers. In some embodiments, the second conductive layer 132 may include an upper layer including W formed on a lower layer including TiSiN.

The capping layer 133 may be an insulator such as a silicon nitride film.

The spacer SP may be an oxide film, a nitride film, an air gap, or a combination thereof. The air gap may be a gap including the atmosphere or other gases that may exist in a manufacturing process of a semiconductor device (i.e., the air gap need not be a gap filled with air, as is understood).

The bit lines BL may be provided in a second interlayer insulating film IL2 and may extend in the third direction, that is, the Y-axis direction (see FIG. 4).

The active regions ACT may be connected to a capacitor CAP through the buried contacts BC.

The buried contacts BC may be formed of a conductive material, for example, at least one of doped polysilicon, a metal material, or conductive metal nitride. In an example, the buried contacts BC may include tungsten W and a tungsten nitride ($W_xN_{1-x}$) film.

The buried contacts BC may extend through the first interlayer insulating film IL1 and the second interlayer insulating film IL2. The first interlayer insulating film IL1 and/or the second interlayer insulating film IL2 may be a silicon oxide film formed by, for example, CVD.

The capacitor CAP may include a lower electrode 180, a dielectric film 181, and an upper electrode 182.

The lower electrode 180 and the upper electrode 182 may include at least one of an impurity-doped semiconductor material, for example, doped polycrystal silicon; conductive metal nitride, for example, titanium nitride, tantalum nitride, or tungsten nitride; metal, for example, ruthenium, iridium, titanium, or tantalum; and conductive metal oxide, for example, iridium oxide.

The dielectric film 181 may be a single film of any one material selected from among metal oxide, for example, $HfO_2$, $ZrO_2$, $Al_2O_3$, $La_2O_3$, $Ta_2O_3$, or $TiO_2$ and a dielectric material having a Perovskite structure, for example, $SrTiO_3$ (STO), $(Ba,Sr)TiO_3$ (BST), $BaTiO_3$, PZT, or PLZT, or a combination of two or more of the above films.

Figure 7:
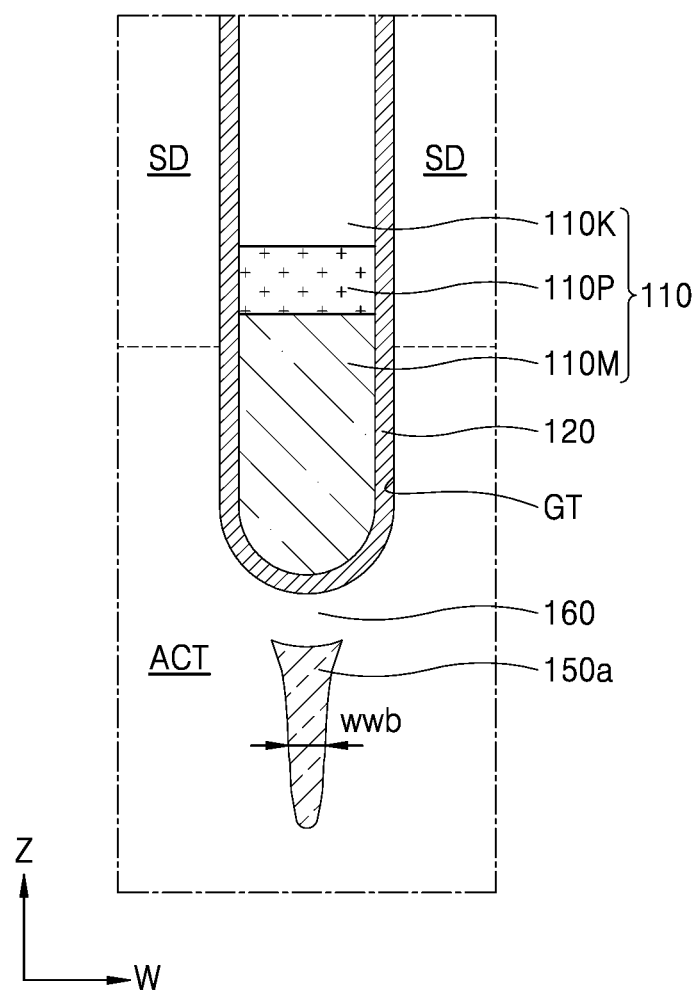
FIG. 7 is a diagram of a gate structure and an insulating barrier film of a semiconductor device according to another embodiment of the inventive concept.

FIG. 7 is a cross section of a gate structure 110 and an insulating barrier film 150a of a semiconductor device according to an embodiment of the inventive concept.

Referring to FIG. 7, the insulating barrier film 150a is provided under the gate structure 110. The insulating barrier film 150a may be arranged under the gate structure 110 spaced apart from a gate trench GT. The gate structure 110 is described in detail with reference to FIG. 5, and thus a repetitive description thereof is omitted.

When an appropriate electric potential is applied to the gate structure 110, a channel may be formed, through which current may flow between the two source/drain areas SD into which impurities are injected. An area where such a channel may be formed is referred to as a channel region (160) and may be formed in an active region ACT extending along the gate dielectric film 120 under the two source/drain areas SD. As the insulating barrier film 150a is an electrical insulator, no current may flow through the insulating barrier film 150a. As current may flow only through a limited area in the active region ACT between the gate dielectric film 120 and the insulating barrier film 150a, leakage current may be reduced.

In the insulating barrier film 150a, the width wwb in the first direction (W-axis direction) of an upper end may be relatively great, and the width wwb in the first direction may decrease as a distance from the gate trench GT increases (i.e., with respect to the cross sectional view of FIG. 7, the insulating barrier film 150a tapers in a downward direction). In some embodiments, an upper surface of the insulating barrier film 150a facing the gate structure 110 may be concave. The upper surface of the insulating barrier film 150a may have a shape such that the upper surface rises in an upward direction (i.e., in the Z-axis direction) from a center of the upper surface to each of the end portions thereof. The upper surface of the insulating barrier film 150a may have a shape that is conformal with respect to the shape of the bottom of the gate trench GT under which it is formed.

The width wwb in the first direction of the upper surface of the insulating barrier film 150a may be less than the width in the first direction of the gate trench GT. In some embodiments, the width wwb in the first direction of the upper surface of the insulating barrier film 150a may be less than the width in the first direction of the gate structure 110.

Figure 8:
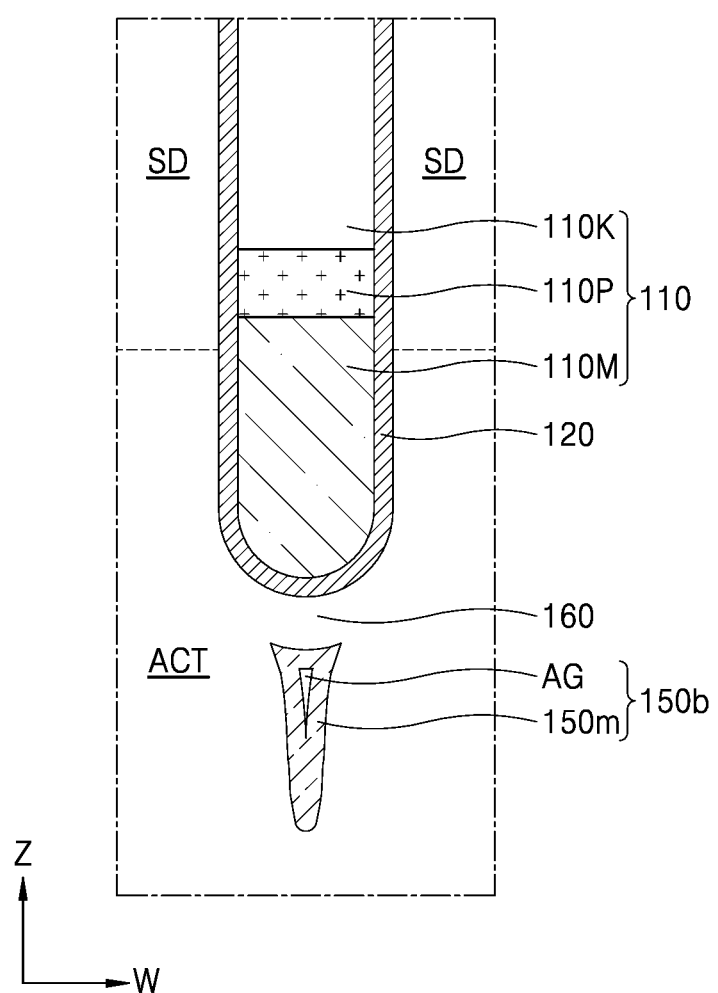
FIG. 8 illustrates a gate structure and an insulating barrier film of a semiconductor device according to another embodiment of the inventive concept.

FIG. 8 is a cross sectional view of the gate structure 110 and an insulating barrier film 150b of a semiconductor device according to another embodiment of the inventive concept.

The embodiment of FIG. 8 is different from the embodiment of FIG. 7 in that the insulating barrier film 150b includes an air gap AG formed therein. Accordingly, in the following description, the difference is mainly described.

Referring to FIG. 8, the insulating barrier film 150b may include an insulating material 150m and the air gap AG. The insulating material 150m may extend form the outer edge of the insulating barrier film 150b. Accordingly, the insulating material 150m may form an outer surface of the insulating barrier film 150b.

The inside of the air gap AG may be vacuous or may be filled with a gas. The gas of the air gap AG may not only be the air in the atmosphere, and may include an atmosphere existing in the manufacturing process of the semiconductor device 100 (e.g., within a deposition chamber when forming insulating barrier 150b.

The insulating barrier film 150b may have one air gap, or may have two or more air gaps separated from each other.

As the air gap AG has a relatively low dielectric constant, the insulating barrier film 150b may effectively prevent the leakage current and also reduce compression stress/tensile stress according to a difference in thermal expansion coefficients between the respective parts forming the semiconductor device 100, in particular, between the channel region 160 and the insulating material 150m. Accordingly, more stable field emission property and improved device reliability may be obtained.

Figure 9:
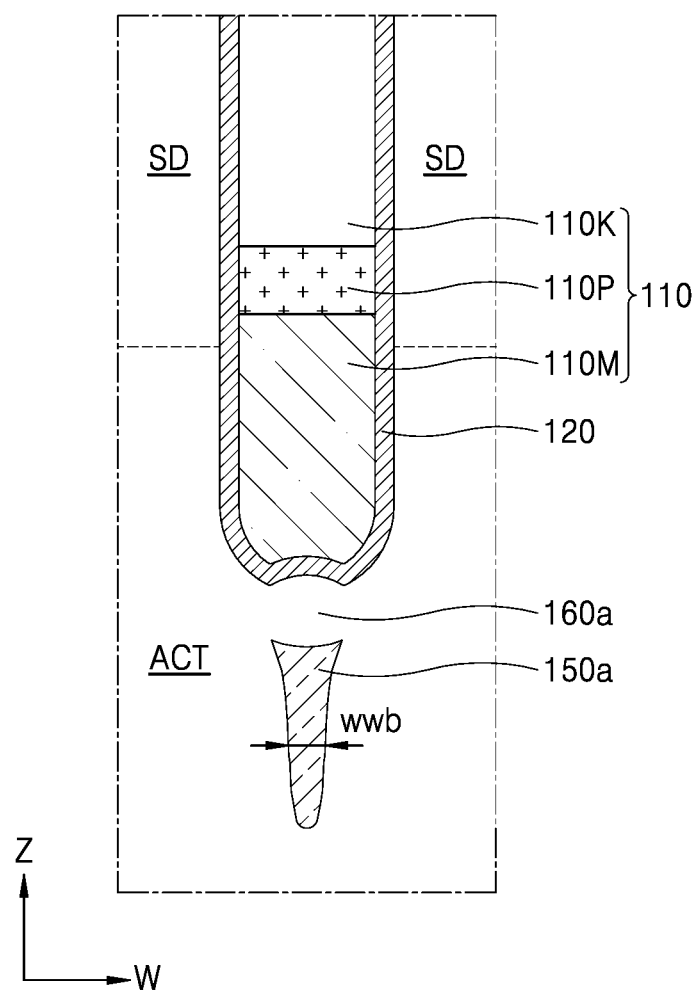
FIGS. 9 to 11 illustrate channel regions of a semiconductor device according to embodiments of the inventive concept.

FIG. 9 illustrates a cross section of a channel region 160a of a semiconductor device according to embodiments of the inventive concept.

The embodiment of FIG. 9 may have the same insulating barrier film 150a as that of the embodiment described with reference to FIG. 7, but may have partially different shapes from those of the channel region 160a and the gate structure 110. Accordingly, the following description focuses only on the differences.

Referring to FIG. 9, the channel region 160a may have an upper surface that is convex and extends toward the gate structure 110 above the insulating barrier film 150a. The specific shape of the channel region 160a may be due to the manufacturing process of the semiconductor device 100, which is described in detail in a description part regarding a manufacturing method.

Figure 10:
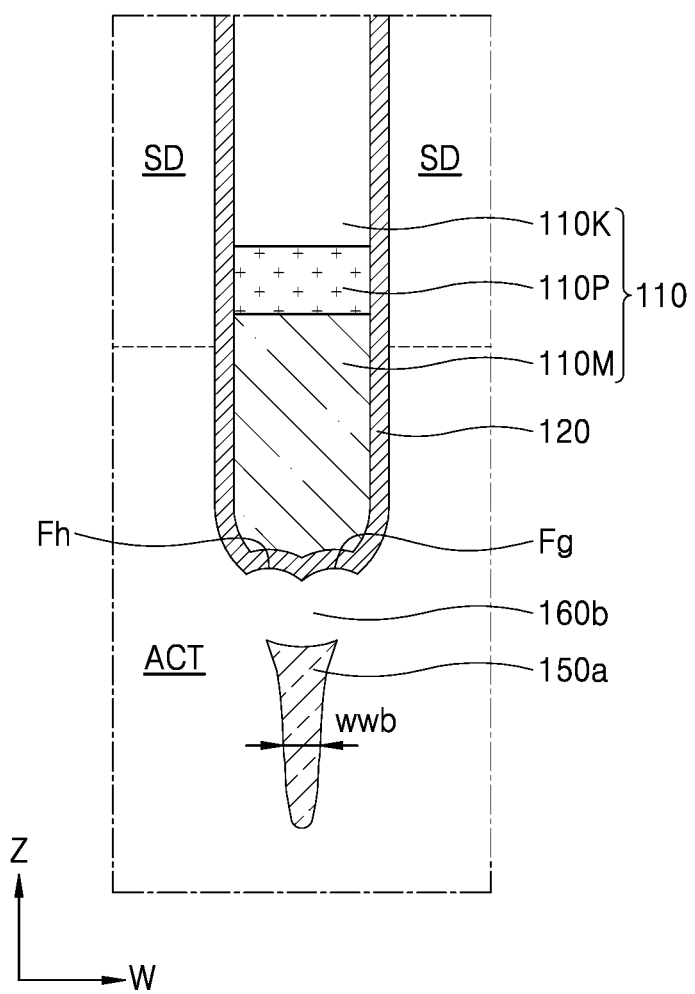

FIG. 10 illustrates a cross section of channel region 160b of a semiconductor device according to embodiments of the inventive concept.

The embodiment of FIG. 10 may have the same insulating barrier film 150a as that of the embodiment described with reference to FIG. 7, but may have partially different shapes from those of the channel region 160b and the gate structure 110. Accordingly, the following description focuses only on the differences.

Referring to FIG. 10, the channel region 160b may have two upper surface portions Fg and Fh that are convex and protrude toward the gate structure 110 and neighbor each other in the first direction, that is, the W-axis direction, above the insulating barrier film 150a. The upper surface portions Fg and Fh may be symmetrical or asymmetrical in size and shape. With respect to the cross sectional view of FIG. 10, the upper surface portions Fg and Fh may be mirror image symmetrical with respect to a vertical line extending through the center of the gate structure 110. The gate dielectric film 120 formed on and in contact with the two convex surface portions Fp and Fq of the channel region 160c may have two concave bottom portions meeting a location below the center of the gate structure 110 (which may be the center of the channel region 160c) and form a centered downwardly projecting ridge and two side downwardly projection ridges to either side that extend in the X direction across the active region ACT and two outside.

The specific shape of the channel region 160b may be due to the manufacturing process of the semiconductor device 100, which is described in detail in the description part regarding a manufacturing method.

Figure 11:
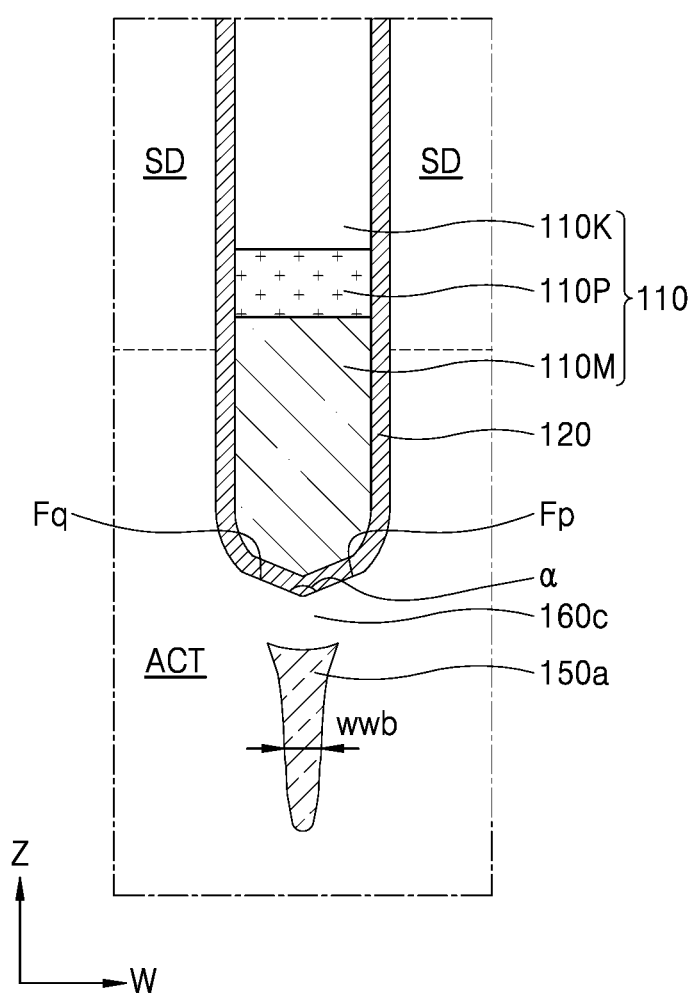

FIG. 11 illustrates a cross section of channel region 160c of a semiconductor device according to embodiments of the inventive concept.

The embodiment of FIG. 11 may have the same insulating barrier film 150a as that of the embodiment described with reference to FIG. 7, but the channel region 160c and the gate structure 110 of the embodiment of FIG. 11 may have partially different shapes from those of the embodiment described with reference to FIG. 7. Accordingly, the following description focuses only on the differences.

Referring to FIG. 11, the channel region 160c may have an upper surface having two flat surface portions Fp and Fq meeting at a certain angle α, above the insulating barrier film 150a. In some embodiments, the angle α may be about 100° to about 160°. The two flat surface portions Fp and Fq may meet at a location beneath the center of the gate structure 110. With respect to the cross sectional view of FIG. 11, the upper surface portions Fg and Fh may be mirror image symmetrical with respect to a vertical line extending through the center of the gate structure 110. The gate dielectric film 120 formed on and in contact with the two flat surface portions Fp and Fq of the channel region 160c may have two flat bottom portions meeting a location below the center of the gate structure 110 (which may be the center of the channel region 160c) and form a downwardly projecting ridge that extends in the X direction across the active region ACT.

The specific shape of the channel region 160c may be due to the manufacturing process of the semiconductor device 100, which is described in detail in the description part regarding a manufacturing method.

The performance of semiconductor devices according to the inventive concept may obtain a reduced leakage current, excellent switching characteristics, and superior reliability.

FIGS. 12A to 12J are side cross-sectional views sequentially illustrating operations of a method of manufacturing the semiconductor device 100, according to embodiments. The embodiments of FIGS. 12A to 12J are similar to the embodiments described with reference to FIGS. 4 to 6, and like reference numerals may denote like elements and redundant descriptions may be omitted.

Figure 12A:
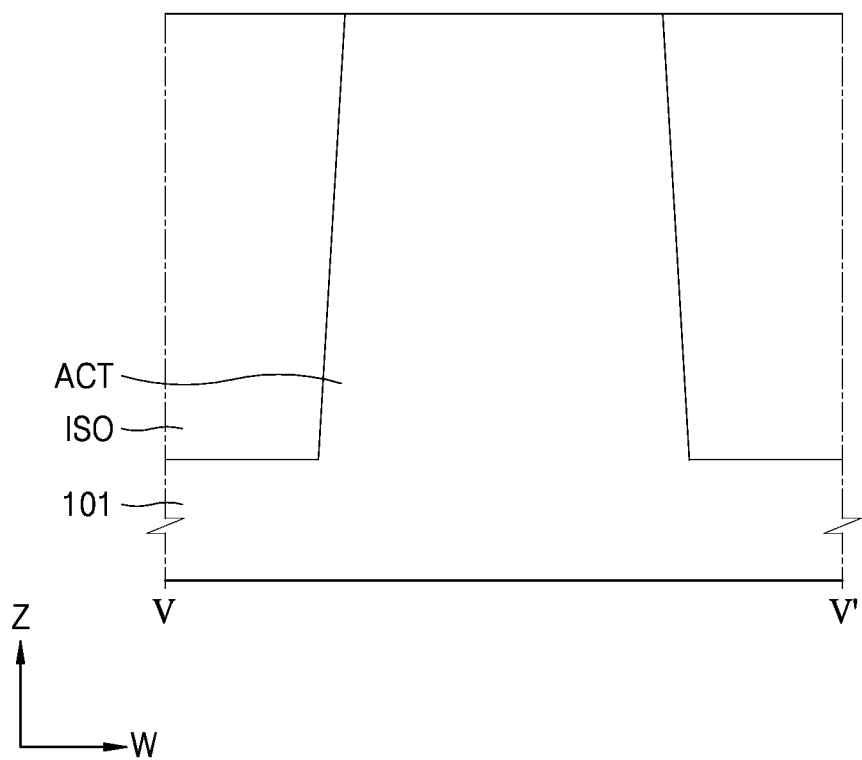
FIGS. 12A to 12J are side cross-sectional views sequentially illustrating operations of a method of manufacturing a semiconductor device, according to an embodiment.

Referring to FIG. 12A, the active regions ACT and the device isolation region ISO are defined in the substrate 101. Since the substrate 101 forming the active regions ACT and the device isolation region ISO is described in detail with reference to FIGS. 5 and 6, detailed descriptions thereof are omitted.

In some embodiments, the definition of the active regions ACT may be achieved by a shallow trench insulation (STI) method. A recess may be formed in the substrate 101 to form the device isolation region ISO. The recess may be formed by performing an anisotropic etching process after forming a mask pattern. Next, a gap fill oxide film may be formed in the recess and then planarized. The gap fill oxide film may be an HDP oxide film, TEOS, PE-TEOS, $O_3$-TEOS, USG, PSG, BSG, BPSG, FSG, SOG, TOSZ, or a combination thereof.

In some examples, active regions ACT may be formed by forming an oxide film (such as those described above as the cap fill oxide film), selectively etched to form trenches exposing portions of substrate 101, and epitaxially growing active regions ACT within each of the trenches using the substrate 101 as a seed layer.

Figure 12B:
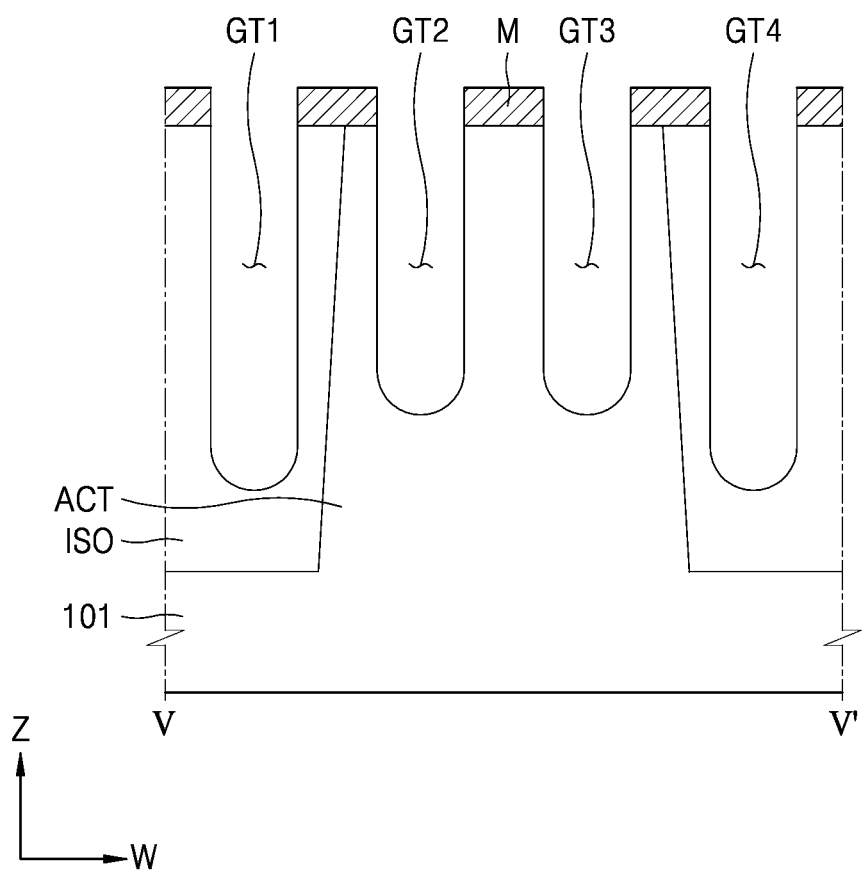

Referring to FIG. 12B, the first to fourth gate trenches GT1, GT2, GT3, and GT4 extending in the X-direction direction are formed. The first to fourth gate trenches GT1, GT2, GT3, and GT4 may be formed by a photolithography method where a photoresist material film for forming a photomask M is formed and then exposed and developed to obtain the photomask M. In some embodiments, the photomask M may be a hard mask that is obtained by etching a hard mask material film by using a mask formed of a photoresist material.

Thereafter, the first to fourth gate trenches GT1, GT2, GT3, and GT4 may be obtained by performing anisotropic etching using the photomask M as an etch mask. In this state, as etching rates of the active regions ACT (e.g., formed of a semiconductor, such as silicon) and the device isolation region ISO (formed of an insulator such as silicon oxide) are different from each other, the bottom surfaces of the first to fourth gate trenches GT1, GT2, GT3, and GT4 have different levels and undulate across active regions ACT and device isolation region ISO. With respect to the cross sectional view of the exemplary device in FIG. 5, the height of the bottom surfaces of the first gate trench GT1 and the fourth gate trench GT4 are different from (here, lower) the height of the bottom surfaces of the second gate trench GT2 and the third gate trench GT3.

The first to fourth gate trenches GT1, GT2, GT3, and GT4 may pass through the device isolation region ISO and the active regions ACT and extend in a horizontal direction, for example, the second direction (X-axis direction) (see FIG. 4). The first to fourth gate trenches GT1, GT2, GT3, and GT4 may extend in a direction perpendicular to or inclined obliquely with respect to a direction of the major axis of the active regions ACT.

The first to fourth gate trenches GT1, GT2, GT3, and GT4 may have substantially the same width. Furthermore, the first to fourth gate trenches GT1, GT2, GT3, and GT4 may be arranged at the substantially same interval (e.g., regularly spaced apart in the Y direction at a fixed pitch).

Figure 12C:
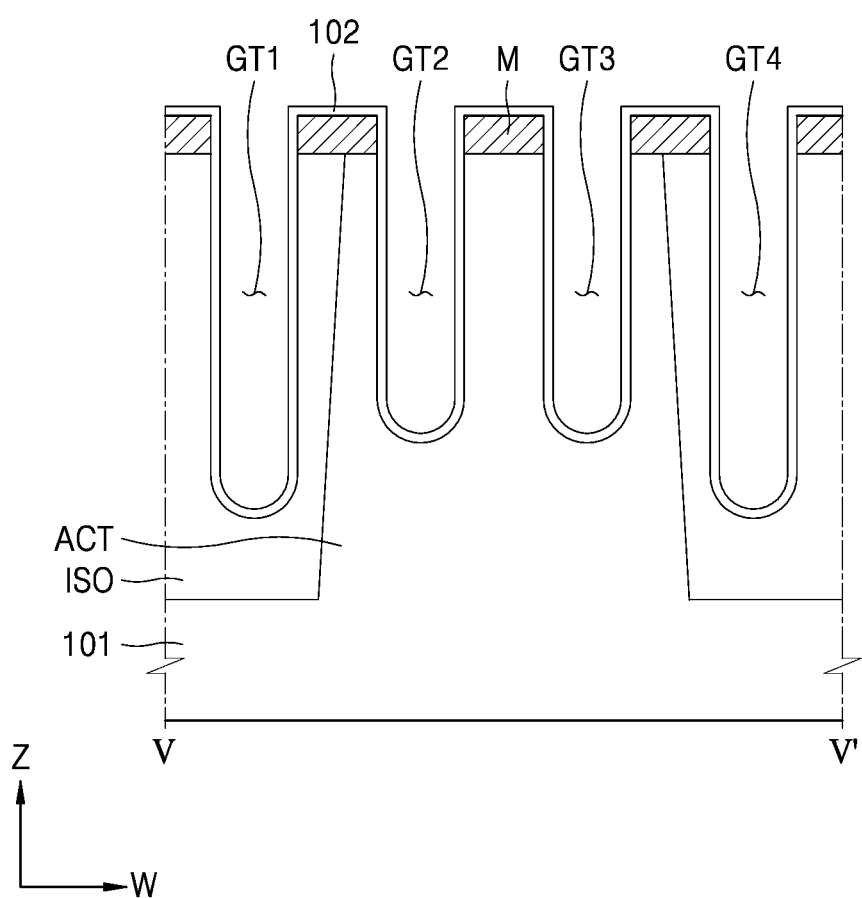

Referring to FIG. 12C, a sacrificial spacer material layer 102 may be formed on an exposed surface of the photomask M and inner surfaces of the first to fourth gate trenches GT1, GT2, GT3, and GT4.

The sacrificial spacer material layer 102 may be silicon oxide, silicon nitride, silicon oxynitride, or a stack of two or more of these or other insulating layers. In some embodiments, the sacrificial spacer material layer 102 may include a carbon-based material, for example, an amorphous carbon layer (ACL) or a spin-on hard mask (SOH). In some embodiments, the sacrificial spacer material layer 102 may be selected to have a high etching selection ratio with respect to the active regions ACT. In other words, a material forming the sacrificial spacer material layer 102 may be selected such that a speed of etching the active regions ACT is remarkably different from a speed of etching the sacrificial spacer material layer 102.

The sacrificial spacer material layer 102 may be formed by a deposition method such as physical vapor deposition (PVD), CVD, and ALD. The sacrificial spacer material layer 102 may be formed to have a thickness of, for example, about 2 nm to about 10 nm.

Figure 12D:
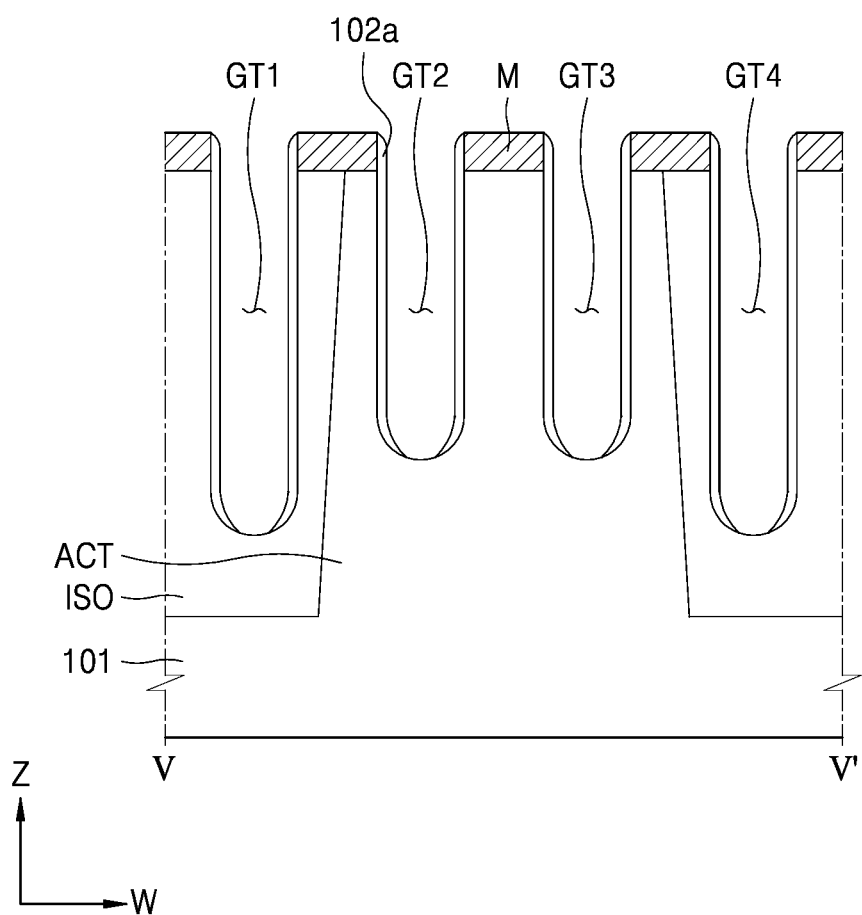

Referring to FIG. 12D, the bottom surfaces of the first to fourth gate trenches GT1, GT2, GT3, and GT4 may be exposed by anisotropically etching the sacrificial spacer material layer 102. In this state, an upper surface of the photomask M may be exposed as well having the sacrificial material layer 102 theron removed.

In this state, as the anisotropic etching is performed, a sacrificial spacer material layer 102a on the side walls of the first to fourth gate trenches GT1, GT2, GT3, and GT4 may be hardly etched and may remain. Furthermore, the thickness of the sacrificial spacer material layer 102 located at a curved portion of the bottom surface of each of the first to fourth gate trenches GT1, GT2, GT3, and GT4 after the anisotropic etching may be determined according to a position of the spacer material layer 102 along the curved portion of the bottom surface. The amount of the sacrificial spacer material layer 102 that is etched and removed may increase as a distance from a vertical portion of the side wall of each of the first to fourth gate trenches GT1, GT2, GT3, and GT4 increases. The openings in the sacrificial spacer material layer 102 may be formed to expose bottom surfaces of the first to fourth gate trenches GT1, GT2, GT3, and GT4. The openings may be centered about a vertical axis of each of the first to fourth gate trenches GT1, GT2, GT3, and GT4 and may be centered about horizontally extending portions of the bottom surfaces of each of the first to fourth gate trenches GT1, GT2, GT3, and GT4 (e.g., in the X-direction).

Figure 12E:
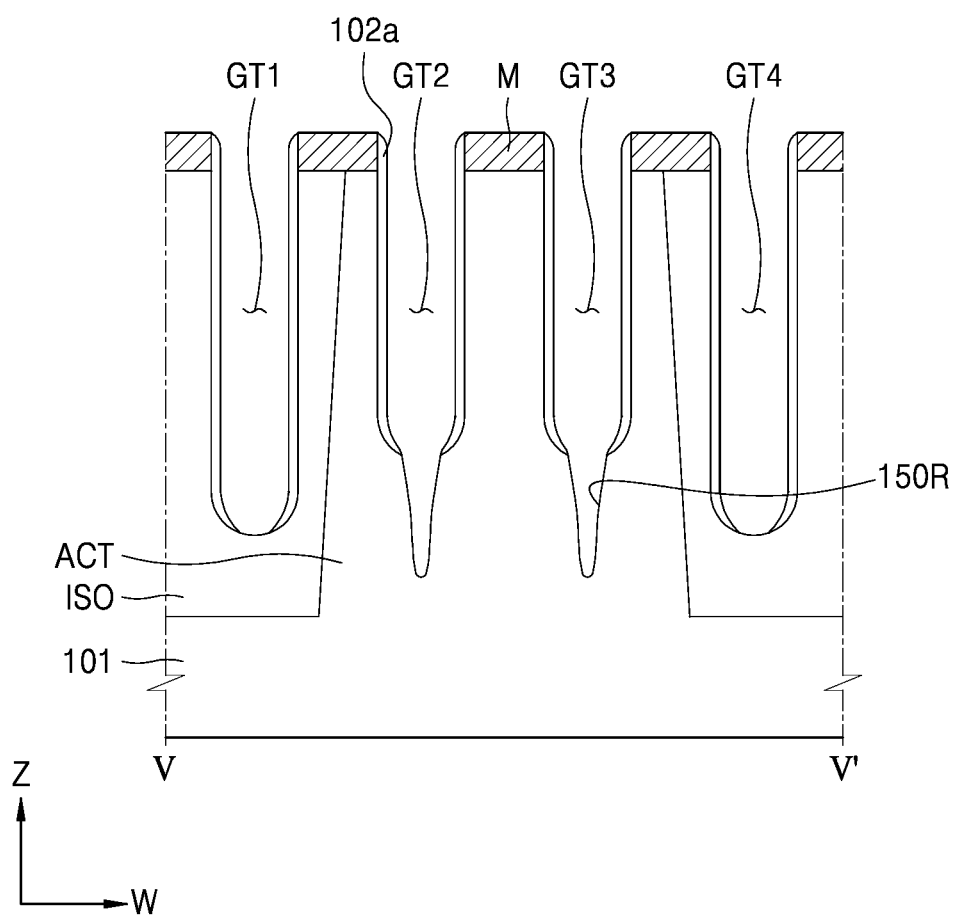

Referring to FIG. 12E, a barrier recess 150R may be formed by etching the exposed bottom surfaces of the first to fourth gate trenches GT1, GT2, GT3, and GT4 of the active regions ACT. In this state, an etching method and an etchant may be selected such that the device isolation region ISO exposed by openings in the spacer material layer 102 at bottom surfaces of the first to fourth gate trenches GT1, GT2, GT3, and GT4 are not etched or are slightly etched.

In this state, the upper surface each of the active regions ACT may be protected from the etchant by the photomask M, and surfaces of the active regions ACT forming the side walls of the first to fourth gate trenches GT1, GT2, GT3, and GT4 may be protected from the etchant by the sacrificial spacer material layer 102a.

The barrier recess 150R may have a trench shape having a narrow lower portion and a wide higher portion (e.g., tapering in a downward direction). Although the side surfaces of the barrier recess 150R may be flat surfaces as shown in FIG. 12E, it may be a curved surface. The barrier recesses 150R may extend through portions of the active regions ACT below the gate trenches GT in a direction parallel to the extension direction of the gate trenches GT (e.g., in the X-direction). Each of the barrier recesses 150R may extend in the extension direction of the gate trenches GT (e.g., X-direction) between opposite sidewalls of a corresponding protruding active region ACT (e.g., between fin sidewalls of a fin shaped active region ACT) (see FIG. 6).

Figure 12F:
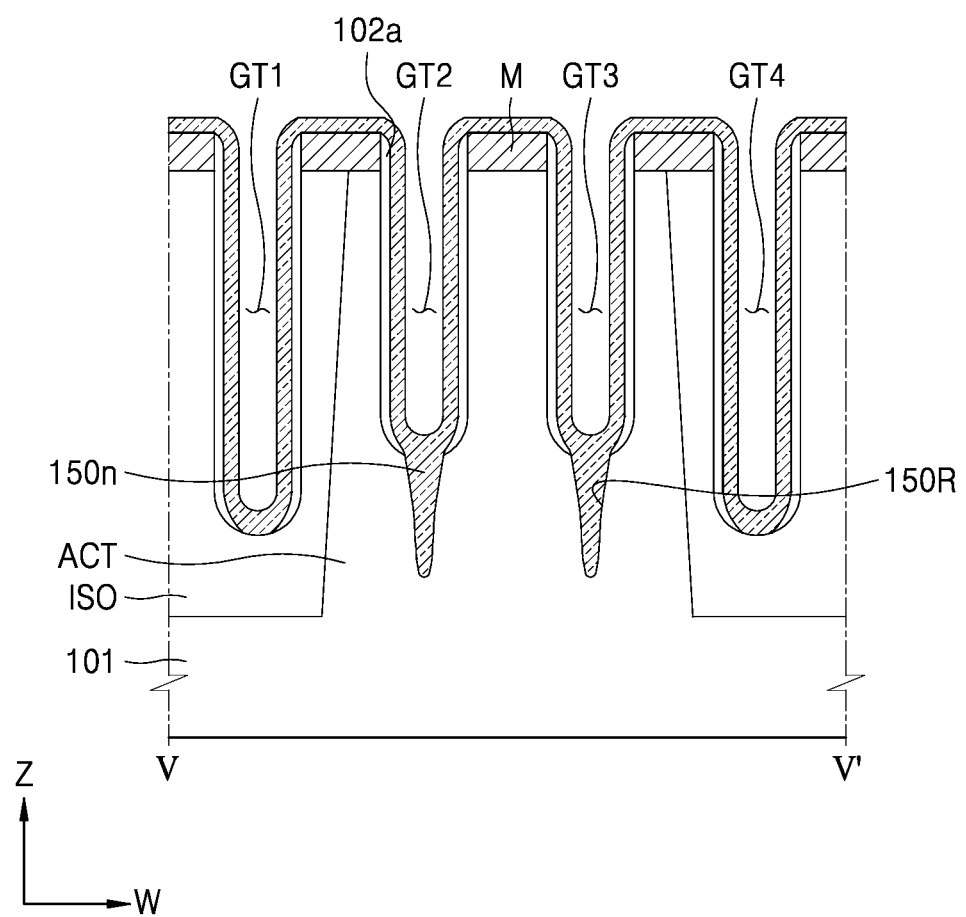

Referring to FIG. 12F, a barrier material layer 150n may be formed across the entire exposed surface of the structure of FIG. 12E and be formed in to fill the barrier recesses 150R. The barrier material layer 150m may be formed of a material that is used to form the insulating barrier film 150 as described herein (e.g., a layer of barrier material 150m). As the material for forming the insulating barrier film 150 is described with reference to FIGS. 4 to 6, an additional description thereof is omitted.

The barrier material 150m may be formed by a well-known deposition method, for example, PVD, CVD, or ALD.

Figure 12G:
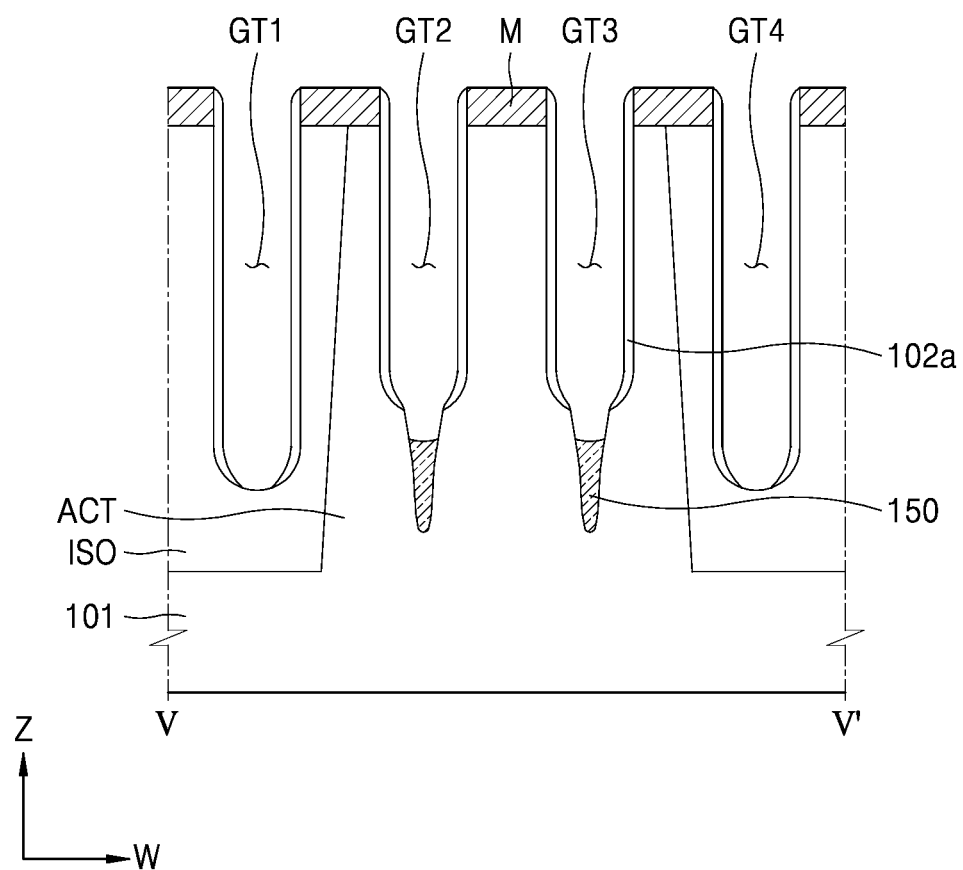

Referring to FIG. 12G, parts of the barrier material 150m may be removed so that remaining portions of the barrier material 150m remain in corresponding barrier recesses 150R and each having a shape defined by the corresponding barrier recess 150R. In detail, the barrier material 150m on the photomask M and on the side walls of the first to fourth gate trenches GT1, GT2, GT3, and GT4 may be removed. Furthermore, the barrier material 150m in the barrier recess 150R may be etched back and partially removed, and thus a part of the active regions ACT forming upper portions of the sidewalls in the barrier recesses 150R may be exposed (as shown in FIG. 12G).

The partial removal of the barrier material 150m may be performed by various methods in a single step or two or more steps. For example, the partial removal of the barrier material 150m may be performed by wet etching, dry etching, or a combination thereof.

By the partial removal of the barrier material 150m, an upper surface of the insulating barrier film 150 in each recess 150R may be concave. The upper surface of the insulating barrier film 150 may have a profile having a height increasing away from its center. Although the shape is not intended to be confined by a specific theory, a central concave shape may be because material transfer occurs more actively in a center portion than an edge portion in the upper surface of the insulating barrier film 150 where the material removal reaction occurs, and thus the removal reaction actively occurs.

In some embodiments, the insulating barrier film 150 may be homogenous and without any voids or seams formed therein. However, in some embodiments, the insulating barrier film 150 may include air gaps therein, as described herein.

Figure 12H:
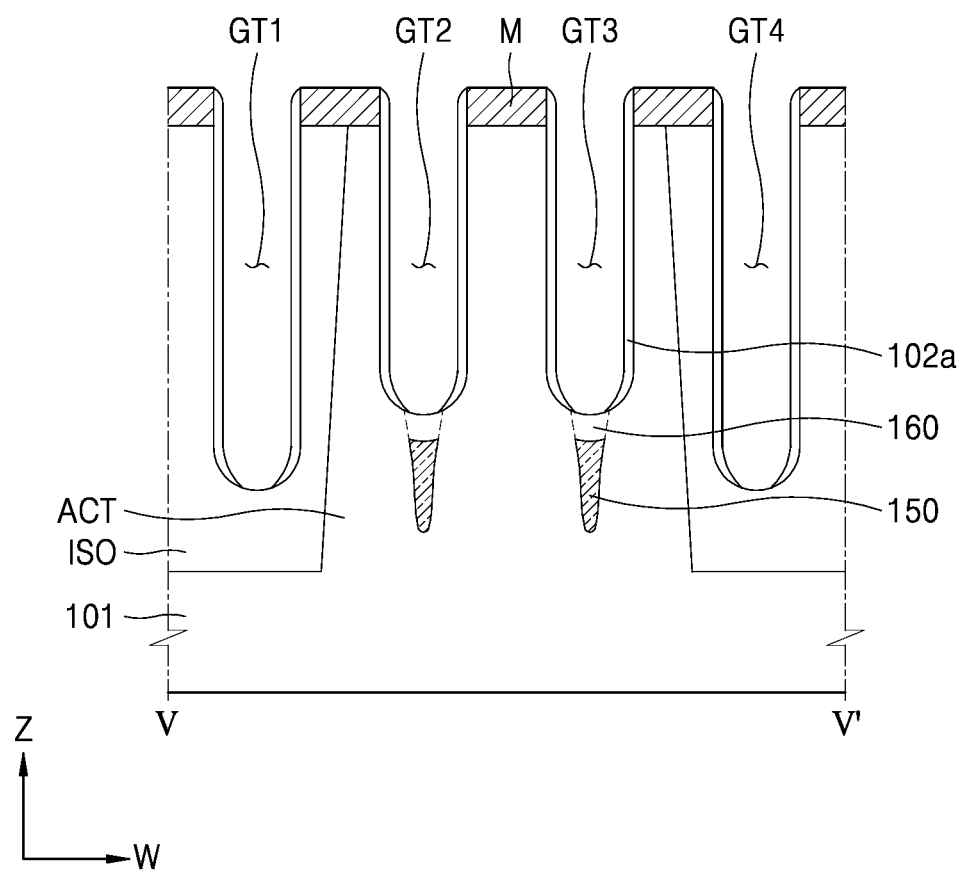

Referring to FIG. 12H, for each of the barrier recesses 150t, the exposed portions of the active region ACT forming upper sidewalls of the barrier recess 150R are connected to each other, and the channel region 160 may be formed.

The connection of the active regions ACT may be performed by various methods.

In some embodiments, the channel region 160 may be formed by performing selective epitaxial growth (SEG) on the active regions ACT having the partially exposed side surfaces. In detail, exposed portions of the active region ACT forming upper sidewalls of the barrier recess 150R may be seed layers from which a crystalline semiconductor material is epitaxially grown, such as being grown from each side in the side direction through the SEG process to meet together in the center of the barrier recess 150R. An interface between the newly formed epitaxial portion of the active region ACT using SEG and the previously present portion of the active region ACT may be observed or may not be recognizable later according to SEG conditions.

In some embodiments, the substrate 101 may be heat-treated for the connection of the active regions ACT. In detail, when the substrate 101 is rapidly heated, portions of the active regions ACT adjacent to and/or forming upper sidewalls of the barrier recess 150R may have momentarily fluidity and may flow over the top of the insulating barrier film 150 (reflow) within the barrier recess 150R. As the material of the active region ACT flows, the material of the active region ACT may meet each other over the insulating barrier film 150 to be integrated with each other. Thereafter, the channel region 160 as illustrated in FIG. 12H may be obtained by lowering the temperature.

Just one of the epitaxial growth and the reflow process may be used to form the channel region 160, or both of these processes may be used with each other to form the channel region 160.

The heating temperature may be, for example, about 350° C. to about 800° C. However, the inventive concept is not limited thereto.

Figure 12I:
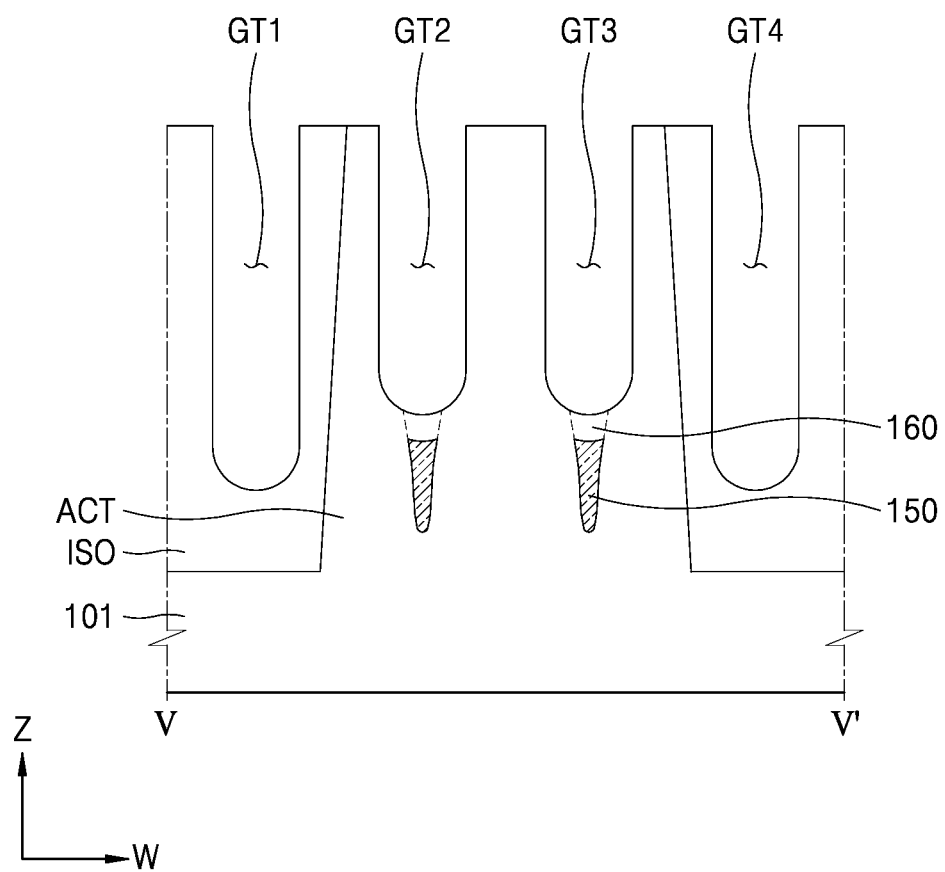

Referring to FIG. 12I, after the channel region 160 is formed, the sacrificial spacer material layer 102a and the photomask M may be removed by, for example, wet etching.

Figure 12J:
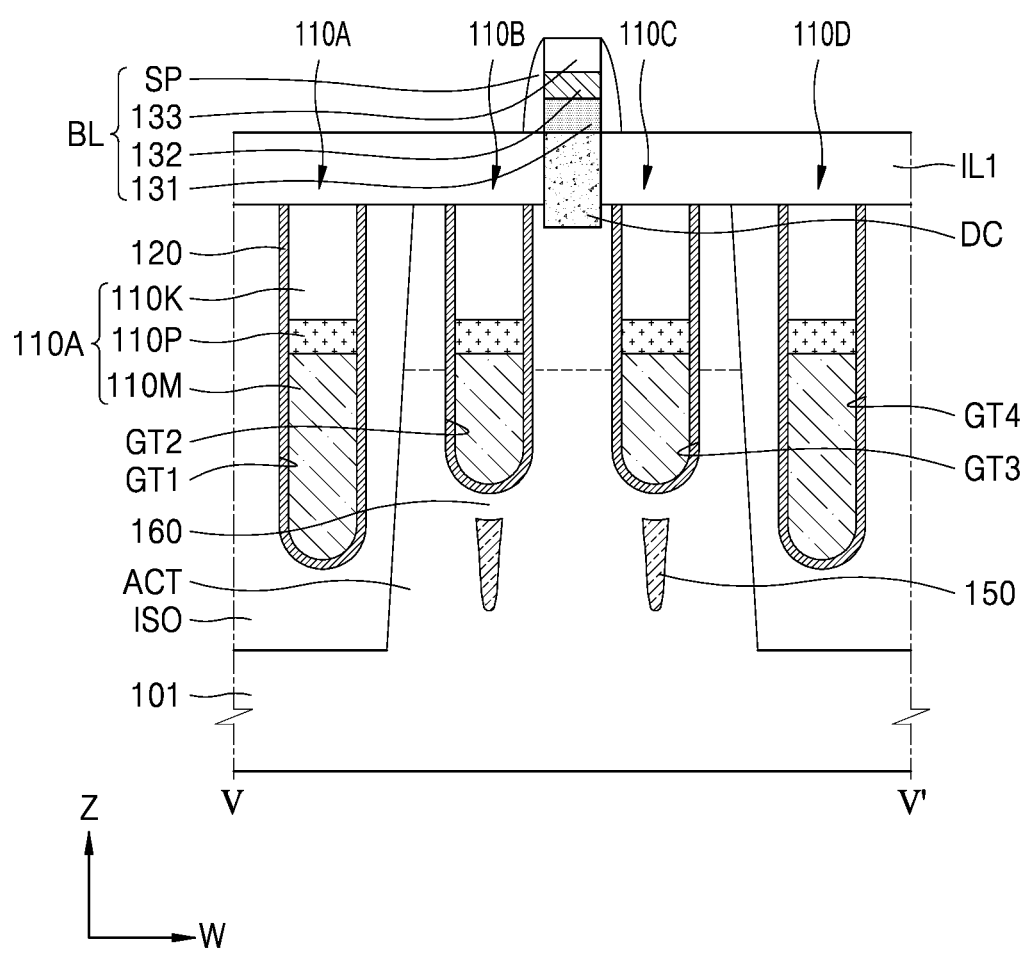

Referring to FIG. 12J, the gate dielectric film 120 is formed in each of the first to fourth gate trenches GT1, GT2, GT3, and GT4, and then the first to fourth gate structures 110A, 110B, 110C, and 110D, each including the lower gate line 110M, the upper gate line 110P, and the capping layer 110K, may be formed on the gate dielectric film 120.

The gate dielectric film 120 may be formed by thermal oxidation of the active regions ACT or deposition of a dielectric material. Thermal oxidation of the active regions ACT may be performed by heating the active regions ACT in an oxidation atmosphere. The deposition of a dielectric material of the gate dielectric film 120 may be performed by a method, for example, PVD, CVD, or ALD, but the inventive concept is not limited thereto. As an available material for the gate dielectric film 120 is described with reference to FIGS. 4 to 6, a redundant description thereof is omitted.

The first to fourth gate structures 110A, 110B, 110C, and 110D may be formed by sequentially depositing (or otherwise forming) the material films of the gate structures, that is, sequentially forming/depositing material films for the gate dielectric film 120, the lower gate line 110M, the upper gate line 110P, and the capping layer 110K. Some of these material films may be formed by depositing a material layer to fill remaining portions of the gate trenches GT and performing an etch back process to remove some of the layer material formed within the gate trenches GT. Planarization may be performed after depositing the material layer and prior to the etch back process.

As described with reference to FIG. 12B, with respect to certain cross sections as illustrated herein, the level of the bottom surface of each of the first gate trench GT1 and the fourth gate trench GT4 of the device isolation region ISO may be lower than the level of the bottom surface of each of the second gate trench GT2 and the third gate trench GT3 of the active regions ACT. Such a configuration is illustrated in the cross section of FIG. 12I. Accordingly, when the first to fourth gate structures 110A, 110B, 110C, and 110D are respectively formed in the first to fourth gate trenches GT1, GT2, GT3, and GT4 in FIG. 12I, the level of the bottom surface of each of the first to fourth gate structures 110A, 110B, 110C, and 110D may be different in with respect to neighboring trenches (e.g., with respect to a vertical cross section) and each of the first to fourth gate structures 110A, 110B, 110C, and 110D may have bottom surfaces at different levels in dependence of the location of the gate structures 110A, 110B, 110C, and 110D being over the device isolation region ISO or the active regions ACT.

Referring to FIG. 6, bottom surfaces of the third gate structure 110C over the device isolation region ISO may have a relatively low level with respect to the bottom surfaces of the third gate structure 110C that are over active regions ACT. As a result, when passing through the active regions ACT, the third gate structure 110C may extend along not only the upper surface Fu of the active regions ACT, but also the two opposite side walls Fa and Fb of the active region ACTs, with the gate dielectric film 120 formed therebetween, and thus a semiconductor device having a wider channel width may be formed (e.g., corresponding to the vertical sidewall dimensions and horizontal top surface dimension of the channel region 160 as shown in FIG. 6).

After the first to fourth gate structures 110A, 110B, 110C, and 110D are formed, the direct contact DC and the bit lines BL, which are electrically connected to the active regions ACT at one side of the second and third gate structures 110B and 110C, may be formed. In detail, after the first interlayer insulating film IL1 is formed, the direct contact DC may be formed. Next, material films for the first conductive layer 131, the second conductive layer 132, and the capping layer 133 are deposited and patterned, and then the spacer SP may be formed on the side walls thereof, thereby forming the bit lines BL.

Next, the second interlayer insulating film IL2 that buries the bit lines BL is formed, and then the buried contacts BC are formed. Capacitors CAP that are electrically connected to the active regions ACT at ends of these top surfaces may be formed. FIG. 5 illustrates two capacitors CAP electrically connected to an active region ACT at outer sides of the second and third gate structures 110B and 110C.

Figure 13A:
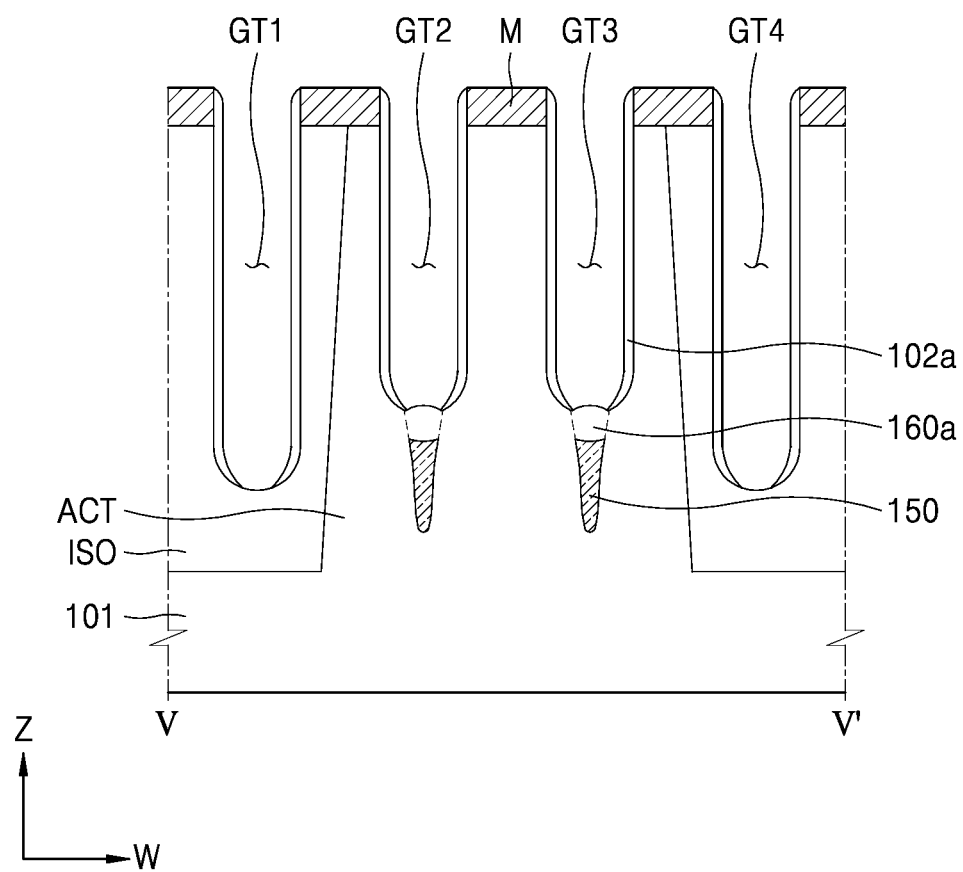
FIG. 13A is a side cross-sectional view illustrating a method of forming the channel region of FIG. 9.

FIG. 13A is a pattern diagram illustrating a method of forming the channel region 160a of FIG. 9.

Referring to FIG. 13A, an outer edge of the channel region 160a that protrudes upward from the gate trench may be obtained by excessively performing the SEG process on the side wall portion of the exposed active regions ACT. In other words, when the SEG process is further performed in a state in which the side walls of the active regions ACT that are separated from each other while exposing the insulating barrier film 150 meet together and are integrated with each other through the SEG process, the channel region 160a that protrudes upward from the gate trench may be obtained.

Thereafter, the above-described processes in FIGS. 12I, 12J, and 5 may be performed, thereby obtaining a semiconductor device.

Figure 13B:
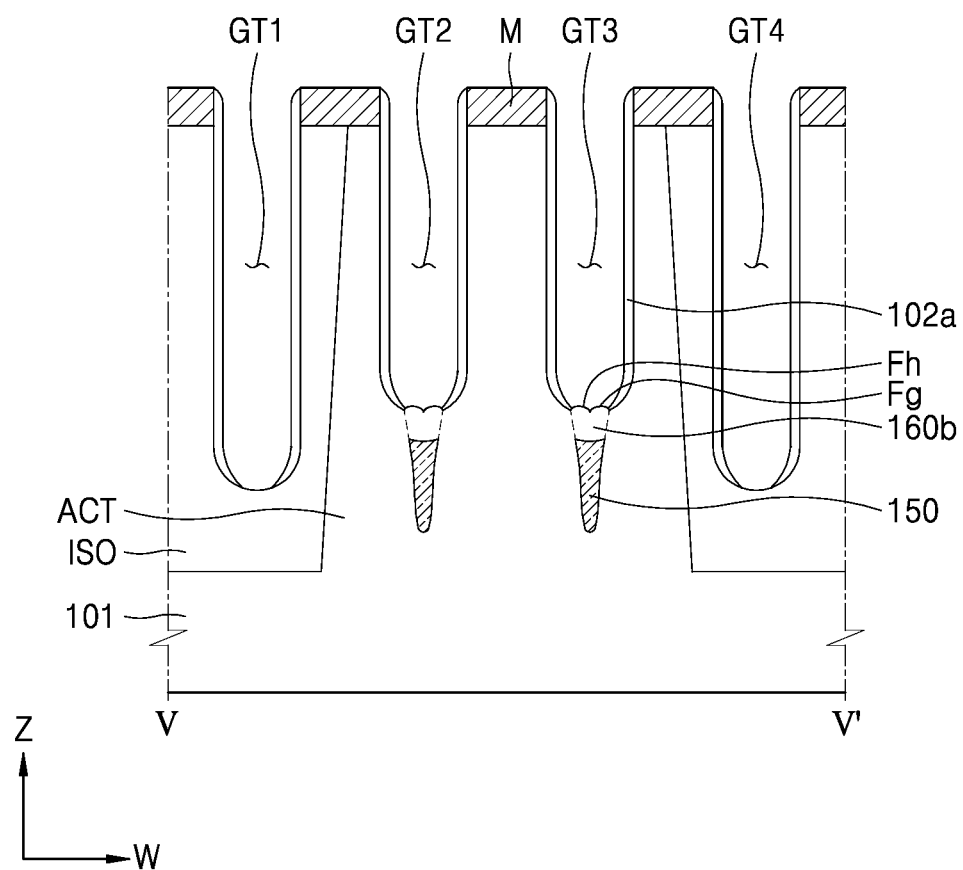
FIG. 13B is a side cross-sectional view illustrating a method of forming the channel region of FIG. 10.

FIG. 13B is a pattern diagram illustrating a method of forming the channel region 160b of FIG. 10.

Referring to FIG. 13B, an outer edge of the channel region 160b having two upper surfaces Fg and Fh that protrude upward from the gate trench and neighbor each other in the first direction, that is, the W-axis direction, may be obtained by excessively performing a reflow process on the side wall portion of the exposed active regions ACT. In other words, when the reflow process is further performed in a state in which the side walls of the active regions ACT that are separated from each other while exposing the insulating barrier film 150 meet together and are integrated with each other through the reflow process, the upper surface Fh that reflows from one side of the gate trench to protrude upward may be obtained and the upper surface Fg that reflows from the other side of the gate trench to protrude upward may be obtained.

Thereafter, the above-described processes in FIGS. 12I, 12J, and 5 may be performed, thereby obtaining a semiconductor device.

Figure 13C:
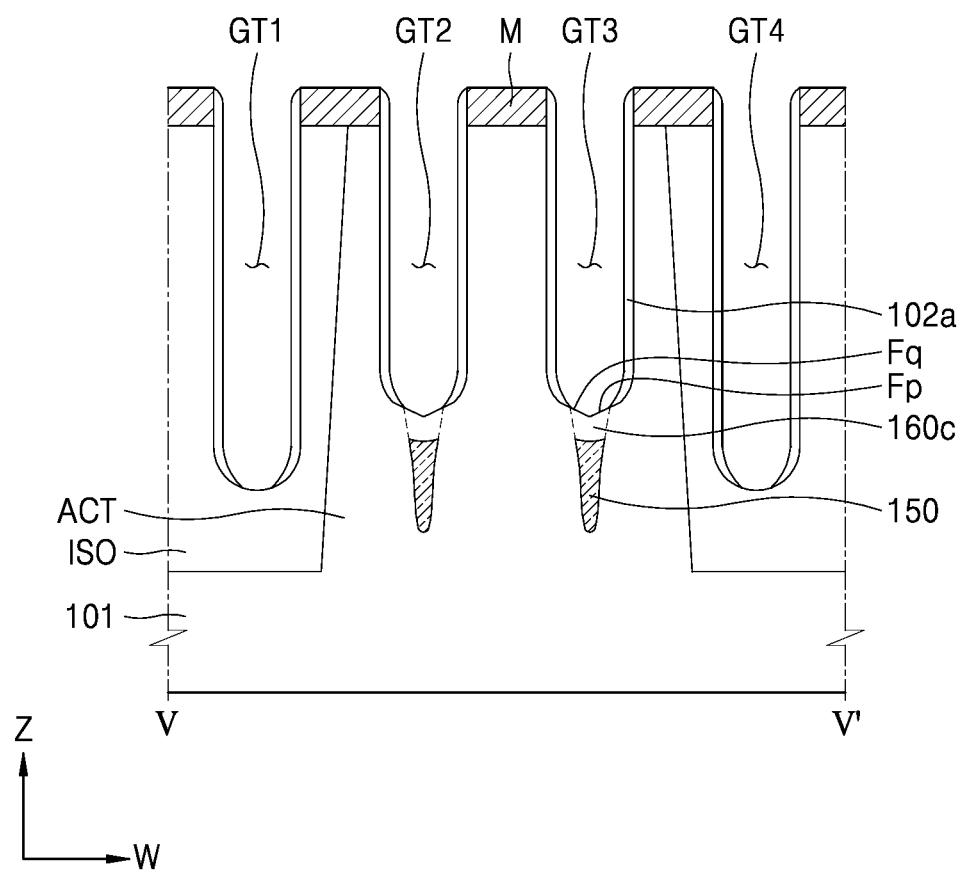
FIG. 13C is a side cross-sectional view illustrating a method of forming the channel region of FIG. 11.

FIG. 13C is a pattern diagram illustrating a method of forming the channel region 160c of FIG. 11.

Referring to FIG. 13C, an outer edge of the channel region 160c having an upper surface including the two flat surfaces Fp and Fq meeting at a certain angle α may be obtained by appropriately adjusting the conditions of the SEG process on the side wall portion of the exposed active regions ACT. In other words, the flat surface Fp that epitaxially grows from one side of the gate trench and the flat surface Fq that epitaxially grows from the other side of the gate trench may have a certain angle α, for example, an angle between about 100° to about 160° by in dependence on the crystal orientation of the exposed side wall portion of the active regions ACT.

Thereafter, the above-described processes in FIGS. 12I, 12J, and 5 may be performed, thereby obtaining a semiconductor device.

Figure 14A:
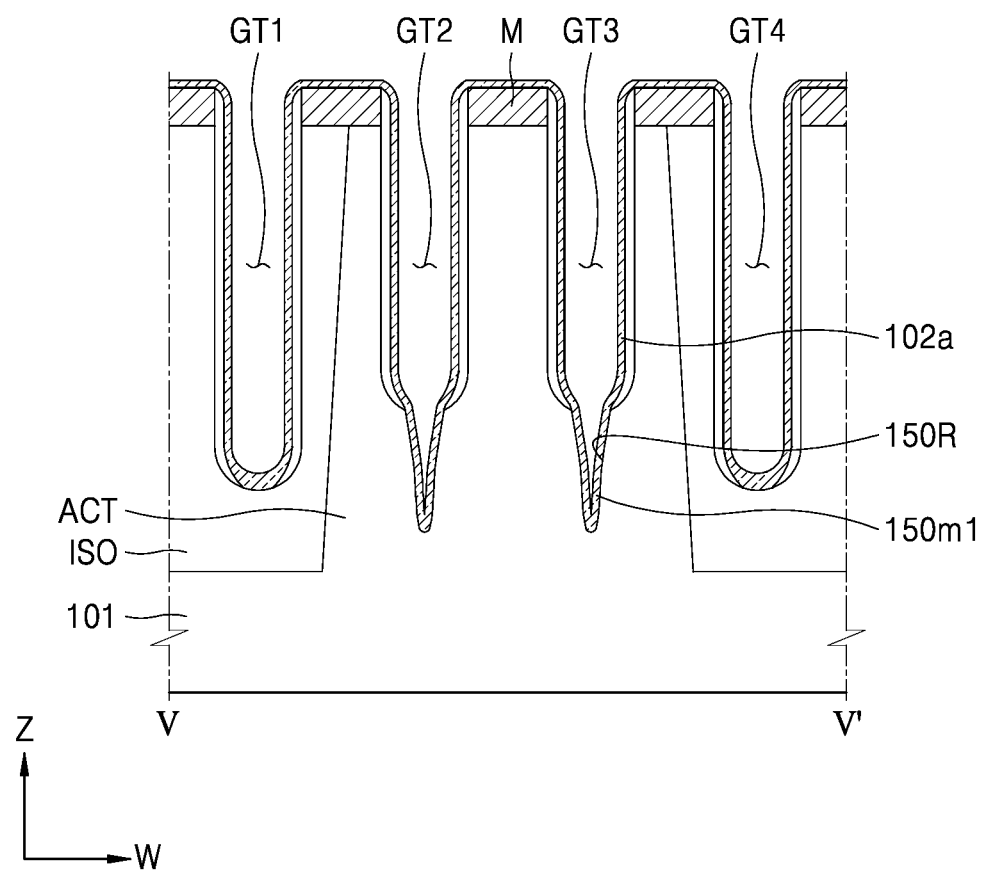
FIGS. 14A and 14B are side cross-sectional views illustrating a method of obtaining an insulating barrier film including an air gap.
Figure 14B:
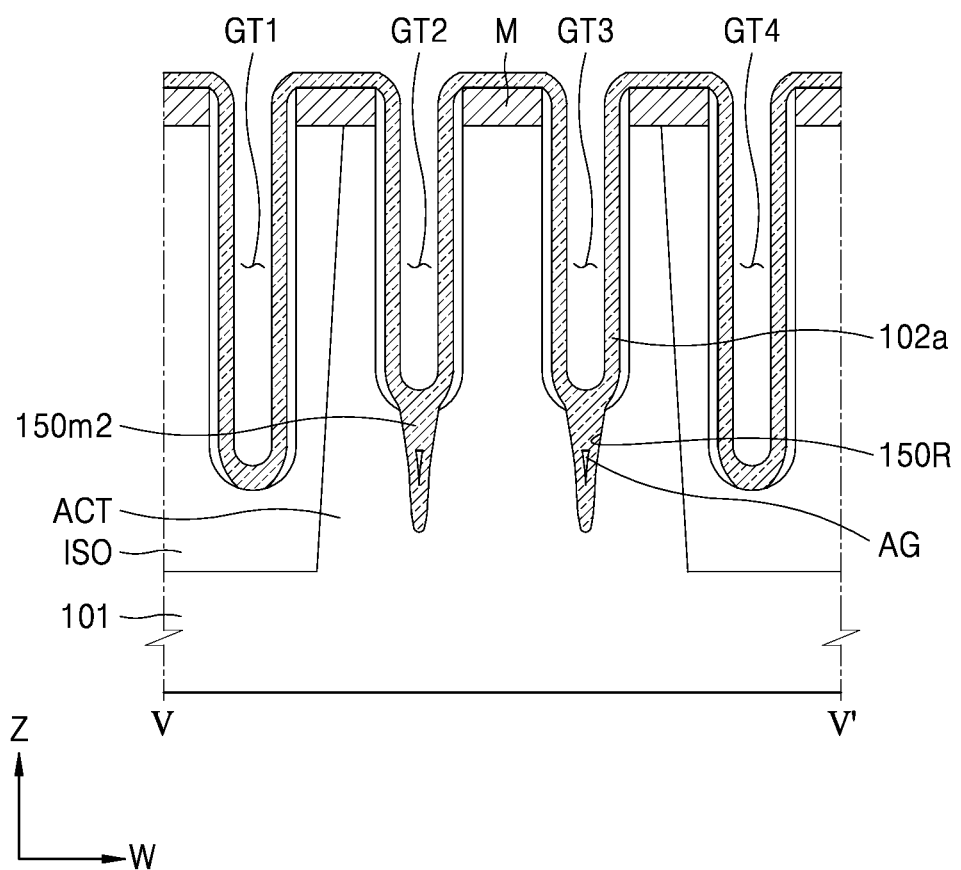

FIGS. 14A and 14B are side views illustrating a method of obtaining the insulating barrier film 150 including an air gap.

FIG. 14A illustrates an operation after the process illustrated in FIG. 12E. Accordingly, the descriptions about the operations of FIGS. 12A to 12E are omitted.

Referring to FIG. 14A, a barrier material 150m1 may be formed at least partially within the barrier recess 150R, extending along sidewalls of the barrier recess 150R.

When the barrier material continues to be deposited around an end portion of the sacrificial spacer material layer 102a (e.g., opening in the bottom) in each of the second gate trench GT2 and the third gate trench GT3, a deposition speed of the barrier material 150m1 at around the end portion may be faster than that of the other portion.

Referring to FIG. 14B, as the deposition speed of a barrier material 150m2 at around the end portion is faster than that of the barrier material 150m2 inside the barrier recess 150R, some of gas in an atmosphere of the deposition process may be captured in the air gap AG.

Thereafter, the above-described processes in FIGS. 12G to 12J and FIG. 5 may be performed, thereby obtaining a semiconductor device.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate provided with a plurality of active regions, each of the active regions extending in a first direction that is a horizontal direction and protruding in a vertical direction;
   a device isolation region electrically isolating the plurality of active regions;
   a gate trench formed in and extending across both the plurality of active regions and the device isolation region;
   a gate structure formed in the gate trench contacting opposite side walls of the gate trench, the gate structure extending through each of the plurality of active regions and along opposite sidewalls of each of the plurality of active regions;
   a gate dielectric film formed between gate trench surfaces and the gate structure in each of the plurality of active regions; and
   an insulating barrier film provided in a first active region of the plurality of active regions under the gate trench, spaced apart from a lower surface of the gate trench and extending in an extension direction of the gate trench,
   wherein, with respect to a cross section that is perpendicular to the extension direction of the gate trench and that is taken through the first active region, the insulating barrier film is positioned under the lowermost point of the gate trench such that a vertical line extending through the lowermost point of the gate trench extends through the insulating barrier film.

2. The semiconductor device of claim 1, wherein a depth of the gate trench in each of the plurality of active regions is shallower than a depth of the gate trench in the device isolation region.

3. The semiconductor device of claim 1, wherein a dimension of the insulating barrier film in the first direction is less than a dimension of the gate trench in the first direction.

4. The semiconductor device of claim 1, wherein the insulating barrier film comprises silicon oxide or silicon nitride.

5. The semiconductor device of claim 4, wherein the insulating barrier film comprises an air gap.

6. The semiconductor device of claim 4, wherein the insulating barrier film has an upper width that is greater than a lower width.

7. The semiconductor device of claim 1, further comprising a channel region disposed between the lower surface of the gate trench and the insulating barrier film.

8. The semiconductor device of claim 7, wherein the channel region comprises an epitaxial semiconductor material formed on the substrate.

9. The semiconductor device of claim 7, wherein a dimension of the insulating barrier film in a channel width direction is substantially the same as a dimension of the first active region in the channel width direction.

10. The semiconductor device of claim 7, wherein a level of a bottom of the insulating barrier film in the first active region is lower than a level of a lower end of the gate structure over the device isolation region.

11. The semiconductor device of claim 7, further comprising:
   capacitors each electrically connected to a corresponding one of the plurality of active regions; and bit lines each electrically connected to a corresponding one of the plurality of active regions.

12. The semiconductor device of claim 7, wherein the channel region has an upper surface that is convex and protrudes toward the gate structure above the insulating barrier film.

13. The semiconductor device of claim 12, wherein the channel region has an upper surface having two portions adjacent to each other in the first direction that are convex and protrude toward the gate structure above the insulating barrier film.

14. The semiconductor device of claim 7, wherein the channel region has an upper surface including two flat surfaces that meet each other above the insulating barrier film at a first angle.

15. A semiconductor device comprising:
a substrate provided with a plurality of active regions, each of the active regions extending in a first direction that is a horizontal direction and protruding in a vertical direction;
a device isolation region electrically isolating the plurality of active regions;
a gate trench formed in and extending across both the plurality of active regions and the device isolation region;
a gate structure formed in the gate trench contacting opposite sidewalls of the gate trench, the gate structure extending through each of the plurality of active regions;
a gate dielectric film formed between surfaces of the gate trench and the gate structure in each of the plurality of active regions; and
an insulating barrier film provided in a first active region of the plurality of active regions under the gate trench, spaced apart from a lower surface of the gate trench and having a width in the first direction that decreases as a distance from the gate trench increases.

16. The semiconductor device of claim 15, wherein the insulating barrier film has an upper surface is concave.

17. The semiconductor device of claim 15,
wherein a depth of the gate trench in each of the plurality of active regions is shallower than a depth of the gate trench in the device isolation region, and
wherein the gate structure contacts opposite sidewalls of each of the plurality of active regions.

18. The semiconductor device of claim 17, wherein a level of an upper surface of the insulating barrier film in the first active region is higher than a level of a bottom surface of the gate trench in the device isolation region.

19. A semiconductor device comprising:
a substrate provided with a plurality of active regions, each of the active regions extending in a first direction that is a horizontal direction and protruding in a vertical direction;
a device isolation region electrically isolating the plurality of active regions;
a gate trench formed in and extending across both the plurality of active regions and the device isolation region;
a gate structure formed in the gate trench contacting opposite sidewalls of the gate trench, the gate structure extending through each of the plurality of active regions;
a gate dielectric film formed between surfaces of the gate trench and the gate structure in each of the plurality of active regions; and
an insulating barrier film provided in a first active region of the plurality of active regions under the gate trench, spaced apart from a lower surface of the gate trench and having an air gap formed therein,
wherein, with respect to a cross section that is perpendicular to the extension direction of the gate trench and that is taken through the first active region, the insulating barrier film is positioned under the lowermost point of the gate trench such that a vertical line extending through the lowermost point of the gate trench extends through the insulating barrier film.

20. The semiconductor device of claim 19, wherein the insulating barrier film extends through the first active region in a first horizontal direction and has a vertical length greater than a horizontal width as measured in a direction perpendicular to the first horizontal direction.

* * * * *